(12) United States Patent
Brochado Reis

(10) Patent No.: US 11,043,940 B1
(45) Date of Patent: Jun. 22, 2021

(54) TIME DIFFERENCE AMPLIFIER WITH DELAY STORAGE UNIT AND SATURATION DETECTOR

(71) Applicant: QUALCOMM Incorporated, San Diego, CA (US)

(72) Inventor: Luis Filipe Brochado Reis, Cork (IE)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/877,144

(22) Filed: May 18, 2020

(51) Int. Cl.
| H03K 5/133 | (2014.01) |
| G04F 10/00 | (2006.01) |
| H03K 3/037 | (2006.01) |
| H03K 19/20 | (2006.01) |

(52) U.S. Cl.
CPC .......... *H03K 5/133* (2013.01); *G04F 10/005* (2013.01); *H03K 3/0377* (2013.01); *H03K 19/20* (2013.01)

(58) Field of Classification Search
CPC ....... H03K 5/133; H03K 19/20; G04F 10/005
See application file for complete search history.

(56) References Cited

U.S. PATENT DOCUMENTS

| 9,189,202 B2* | 11/2015 | Burleson | G06F 7/588 |
| 10,061,272 B2* | 8/2018 | Chiu | H03M 1/1245 |
| 2011/0304361 A1* | 12/2011 | Henzler | G04F 10/005 |
|  |  |  | 327/105 |

OTHER PUBLICATIONS

Ziabakhsh et al., An All-Digital High-Resolution Programmable Time-Difference Amplifier Based on Time Latch, 2018, IEEE (Year: 2018).*

* cited by examiner

*Primary Examiner* — Thomas J. Hiltunen
(74) *Attorney, Agent, or Firm* — Loza & Loza, LLP

(57) ABSTRACT

A time difference amplifier (TDA) including a first delay storage unit (DSU) configured to generate a first output signal including a first transition in response to a first transition of a first input signal and a first transition of a first read signal, and a second DSU configured to generate a second output signal including a second transition in response to a second transition of a second input signal and a second transition of a second read signal. A first delay between the first and second transitions of the first and second output signals is based on a second delay between the first and second transitions of the first and second input signals and a third delay between the first and second transitions in the first and second read signals. First and second delay elements generate the first and second read signals by delaying the first and second input signals.

30 Claims, 7 Drawing Sheets

US 11,043,940 B1

TIME DIFFERENCE AMPLIFIER WITH DELAY STORAGE UNIT AND SATURATION DETECTOR

FIELD

Aspects of the present disclosure relate generally to time difference amplifiers (TDAs), and in particular, to a time difference amplifier (TDA) including a delay storage unit (DSU) and saturation detector.

DESCRIPTION OF RELATED ART

In certain situations, there may be a need to measure a phase difference or delay between two signals. More specifically, such phase difference or delay may be the delay between two closest transitions or edges of the same type (e.g., a delay between the closest rising edges or falling edges of two signals, respectively). For example, there may be a need to measure clock jitter; that is, the variation of the period of the clock over time. In such example, the first signal may be the clock signal and the second signal may be the delayed clock signal. Such measurement of a phase difference or delay (e.g., jitter measurement) may be useful in sequential circuits, phase locked loops (PLLs), voltage and current measurement circuits, etc.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus. The apparatus includes a time difference amplifier (TDA) including a first NOR gate including a first input to receive a first input signal and a second input to receive a reset signal; a first delay element including an input to receive the first input signal; a second NOR gate including a first input to receive a second input signal and a second input to receive the reset signal; a second delay element including an input to receive the second input signal; a logic gate including inputs coupled to outputs of the first and second NOR gates, respectively; a first delay storage unit (DSU) including a first input coupled to the output of the first NOR gate, a second input coupled to an output of the first delay element, a third input coupled to an output of the logic gate, and an output to generate a first output signal; and a second delay storage unit (DSU) including a first input coupled to the output of the second NOR gate, a second input coupled to an output of the second delay element, a third input coupled to the output of the logic gate, and an output to generate a second output signal.

Another aspect of the disclosure relates to an apparatus. The apparatus includes a time difference amplifier (TDA) including a first delay storage unit (DSU) configured to generate a first output signal including a first transition in response to a first transition of a first input signal and a first transition of a first read signal; and a second DSU configured to generate a second output signal including a second transition in response to a second transition of a second input signal and a second read signal; wherein a first delay between the first and second transitions of the first and second output signals is based on a second delay between the first and second transitions of the first and second input signals and a third delay between the first and second transitions of the first and second read signal, respectively.

Another aspect of the disclosure relates to a method. The method includes generating a first output signal including a first transition in response to a first transition of a first input signal and a first transition of a first read signal; and generating a second output signal including a second transition in response to a second transition of a second input signal and a second transition of a second read signal; wherein a first delay between the first and second transitions of the first and second output signals is based on a second delay between the first and second transitions of the first and second input signals and a third delay between the first and second transitions in the first and second read signals, respectively.

Another aspect of the disclosure relates to an apparatus. The apparatus includes means for generating a first output signal including a first transition in response to a first transition of a first input signal and a first transition of a first read signal; and means for generating a second output signal including a second transition in response to a second transition of a second input signal a second transition of a second read signal; wherein a first delay between the first and second transitions of the first and second output signals is based on a second delay between the first and second transitions of the first and second input signals and a third delay between the first and second transitions in the first and second read signals, respectively.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
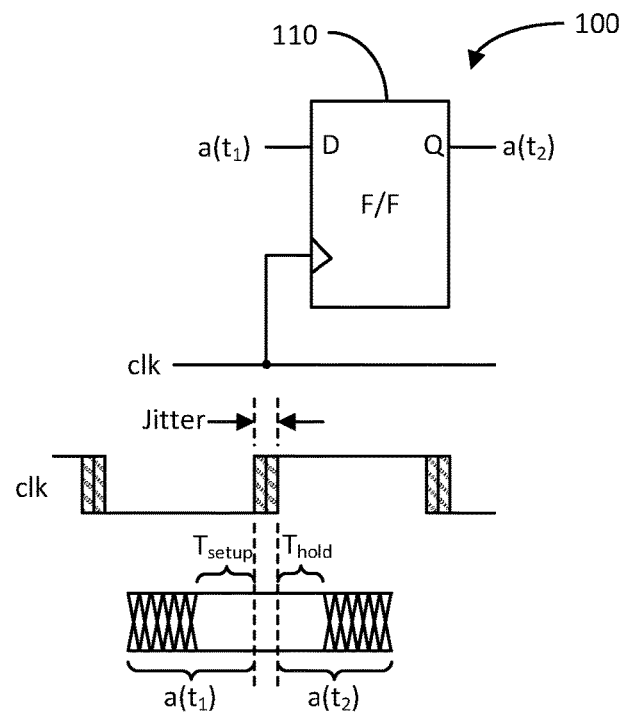
FIG. 1 illustrates schematic and associated timing diagrams of an exemplary sequential circuit in accordance with aspect of the disclosure.

FIG. 1 illustrates schematic and associated timing diagrams of an exemplary sequential circuit 100 in accordance with aspect of the disclosure. This is a simplified sequential circuit 100 for explanation purposes. The sequential circuit 100 includes a data flip-flop (F/F) 110 with a signal $a(t_1)$ applied to its data input (D) at time $t_1$ to generate or clock out the signal $a(t_2)$ at its data output (Q) at a later time $t_2$. The data flip-flop (F/F) 110 includes a clock input configured to receive a clock (clk). The data flip-flop (F/F) 110 is configured to transfer the signal $a(t_1)$ from the data input (D) to the data output (Q) as signal $a(t_2)$ in response to a clocking (e.g., rising) edge of the clock.

To ensure (or improve the likelihood) that the flip-flop 110 correctly clocks out or launches the input signal $a(t_1)$ to generate the output signal $a(t_2)$, the input signal $a(t_1)$ should be substantially stable or constant for at least a setup time interval $T_{setup}$ before the clocking edge of the clock, and the output signal $a(t_2)$ should also be substantially stable or constant for at least a hold time interval $T_{hold}$ after the clocking edge of the clock. These requirements are sometimes referred to as providing timing margin to sequential circuits to ensure proper operation of the circuits. Thus, as illustrated in the timing diagram of FIG. 1, the input signal $a(t_1)$ may toggle before the beginning of the setup time interval $T_{setup}$, but needs to be substantially constant during the $T_{setup}$ interval. Similarly, the output signal $a(t_1)$ may toggle after the end of the hold time interval $T_{hold}$, but needs to be substantially constant during the $T_{hold}$ interval.

Note, also illustrated, the clocking edge of the clock may not arrive at the time it should according to a constant period of the clock. This may be because the period of the clock may be varying over time. This is referred to as clock jitter. In FIG. 1, clock jitter is represented by a time region represented by a diagonal hatch line region, with the center of the region being the time where the clock edge should arrive if no jitter were present. The time region is a statistical time region within which the clocking edge is statistically to occur.

In order to ensure (or improve the likelihood) of proper operation of the sequential circuit 100, the setup time interval $T_{setup}$ should be set in accordance to the worst case jitter of the clock. In the case of the setup time interval $T_{setup}$, the worst case is the earliest time that the clocking edge of the clock arrives according to the statistical time region. Thus, as illustrated, the setup time interval $T_{setup}$ extends from the earliest possible clock edge arrival backwards in time for a duration in which the signal $a(t_1)$ should be substantially constant to ensure proper operation of the flip-flip 110. Similarly, for the case of the hold time interval $T_{hold}$, the worst case is the latest time that the clocking edge of the clock arrives according to the statistical time region. Thus, as illustrated, the hold time interval $T_{hold}$ extends from the latest possible clock edge arrival forward in time for a duration in which the signal $a_{(t2)}$ should be substantially constant to ensure proper operation of the flip-flop 110.

As the setup time interval $T_{setup}$, hold time interval $T_{hold}$, and the clock jitter consumes a certain portion of the clock period, the maximum operating frequency of the clock is limited by the amount of jitter. Thus, there is a need to measure the clock jitter in order to determine the maximum operating frequency of the sequential circuit 100, especially those sequential circuits that are in critical data paths. The following describes some examples of clock jitter measurement circuits and associated components.

Figure 2:
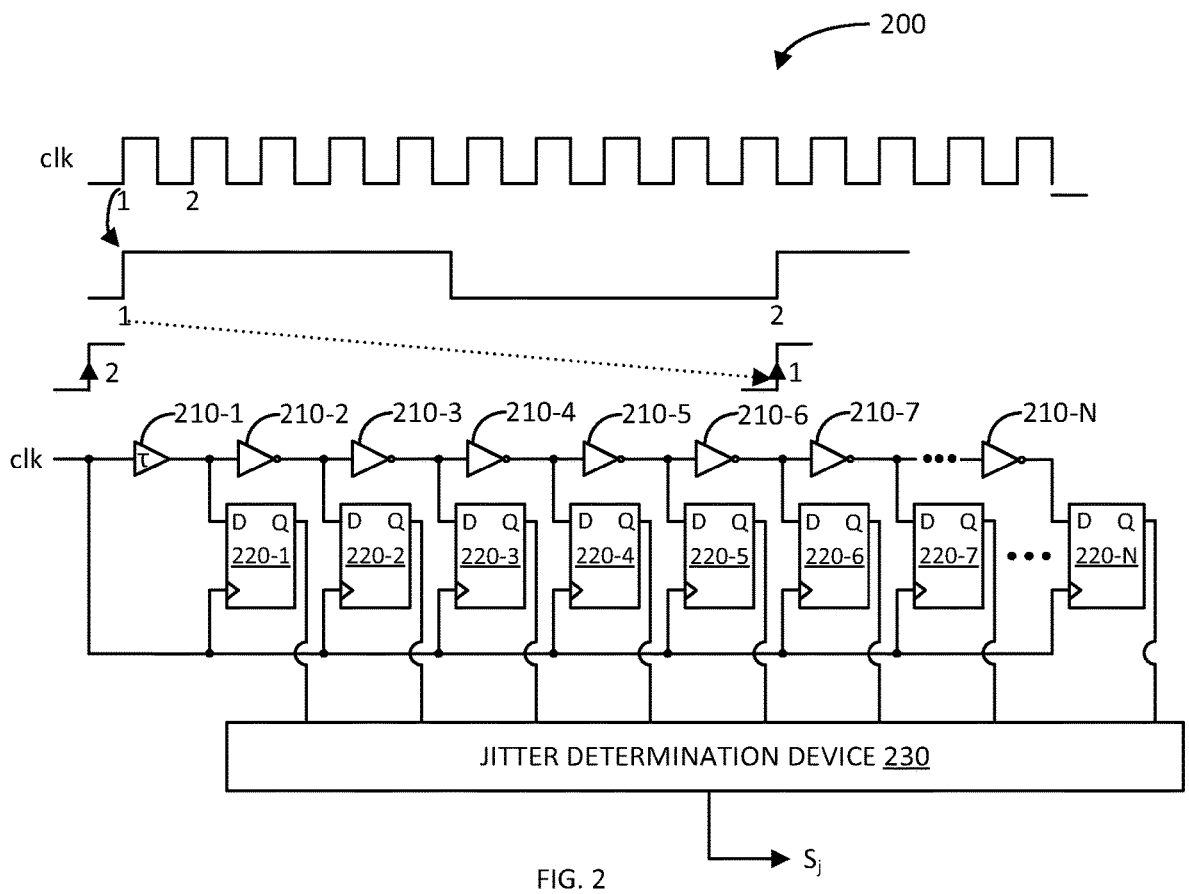
FIG. 2 illustrates schematic and timing diagrams of an exemplary time-to-digital circuit (TDC) including a jitter determination device in accordance with another aspect of the disclosure.

FIG. 2 illustrates schematic and timing diagrams of an exemplary time-to-digital circuit (TDC) 200 in accordance with another aspect of the disclosure. The TDC 200 is configured to measure clock jitter. The TDC 200 operates by sampling a previous clock edge with a current clock edge. By determining which one of a set of sequential flip-flops samples the previous clock edge, a jitter determination of the clock can be made. The sampling of the previous clock edge with a current clock edge continues or repeats to provide a statistical variation of the clock jitter.

More specifically, the TDC 200 includes a set of cascaded (series-connected) delay elements, such as delay element 210-1 and inverters 210-2 to 210-N. The delay element 210-1 may have a large delay as compared to the individual delay of the inverters 210-2 to 210-N, and may itself include a series of cascaded delay elements. The cumulative delay of the set of cascaded delay elements 210-1 to 210-N are configured to produce a delay substantially equal to the longest statistical clock period due to jitter.

Thus, if a clock is applied to the input of the set of cascaded delay elements 210-1 to 210-N, the previous edge of the clock should propagate to the output of the last delay element 210-N by the time the current edge of the clock arrives for the case of the longest statistical clock period. For the case of the statistical mean of the clock period, the previous edge of the clock should propagate to the output of a delay element in the middle of the chain (e.g., delay element 210-6, as depicted) by the time the current edge of the clock arrives. Similarly, for the case of the shortest statistical clock period, the previous edge of the clock should propagate to the output of the first delay element 210-1 by the time the current edge of the clock arrives.

The TDC 200 includes a set of flip-flops 220-1 to 220-N including data inputs (D) coupled to outputs of the set of cascaded delay elements 210-1 to 210-N, respectively. The set of flip-flops 220-1 to 220-N includes clock inputs configured to receive the clock (clk). The TDC 200 further includes a jitter determination device 230 including inputs coupled to data outputs (Q) of the flip-flops 220-1 to 220-N, respectively. The jitter determination device 230 is configured to generate a jitter measurement signal $S_j$ based on the data at the outputs of the set of flip-flops 220-1 to 220-N.

In operation, the clock, as illustrated on the top timing diagram of FIG. 2, is applied to the input of the set of the cascaded delay elements 210-1 to 210-N (in particular, the input of delay element 210-1), and the clock inputs of the set of flip-flops 220-1 to 220-N. As illustrated, the first clocking (e.g., rising) edge (labeled as edge "1") of the clock propagates down the set of cascaded delay elements 210-1 to 210-N until the next clocking edge (labeled as edge "2") arrives at the clock inputs of the set of flip-flops 220-1 to 220-N.

In response to the next clocking edge, the set of cascaded flip-flops 220-1 to 220-N clock out the data at their respective inputs (D). Thus, the particular flip-flop that clocks out or samples the first edge of the clock is an indication of the current jitter of the clock. For instance, in the illustrated example, the flip-flop 220-6 clocks out or samples the first edge of the clock. Thus, by receiving the data outputted by the set of flip-flops 220-1 to 220-N, the jitter determination device 230 is configured to generate the jitter measurement signal $S_j$ indicative of the jitter of the clock.

Thus, if the period of the clock is substantially constant, the same flip-flop (e.g., flip-flop 220-6) always clocks out or samples the previous edge of the clock. However, if there is jitter in the clock period, different flip-flops clock out or sample the previous edges of the clock. For example, if the current clock jitter is longer than the mean, then flip-flop 220-7 (or further down the chain) clocks out or samples the previous edge of the clock. Conversely, if the current clock jitter is shorter than the mean, then flip-flop 220-5 (or further up the chain) clocks out or samples the previous edge of the clock.

A drawback of the TDC 200 is that the resolution of the jitter measurement is based on the individual delay of the inverters 210-2 to 210-N. Additionally, the resolution of the jitter measurement is also dependent on the capturing window of the flip-flops 220-1 to 220-N. For example, if jitter measurement on a 5-6 Giga Hertz (GHz) clock is desired, the TDC 200 may not have the sufficient resolution to capture that jitter. Some approaches to increasing the resolution of a TDC results in substantial increases power consumption and area. For example, one approach is to generate two phases of the clock (e.g., 180 degrees out-of-phase or half-period difference), and provide two sets of flip-flops for the two clock phases, respectively. This effectively increases the resolution of the TDC by two. However, this comes at a price of substantial power consumption by the two-phase generator (e.g., which may consume 40% of the total power consumption) and the extra set of flip-flops. Additionally, the added components (phase generator and flip-flops) substantially increases the circuit area of the TDC. Furthermore, this TDC scales by a factor of two flip-flops, e.g., increasing the length of the delay chain requires increasing the number of flip-flops by an order of two.

Figure 3:
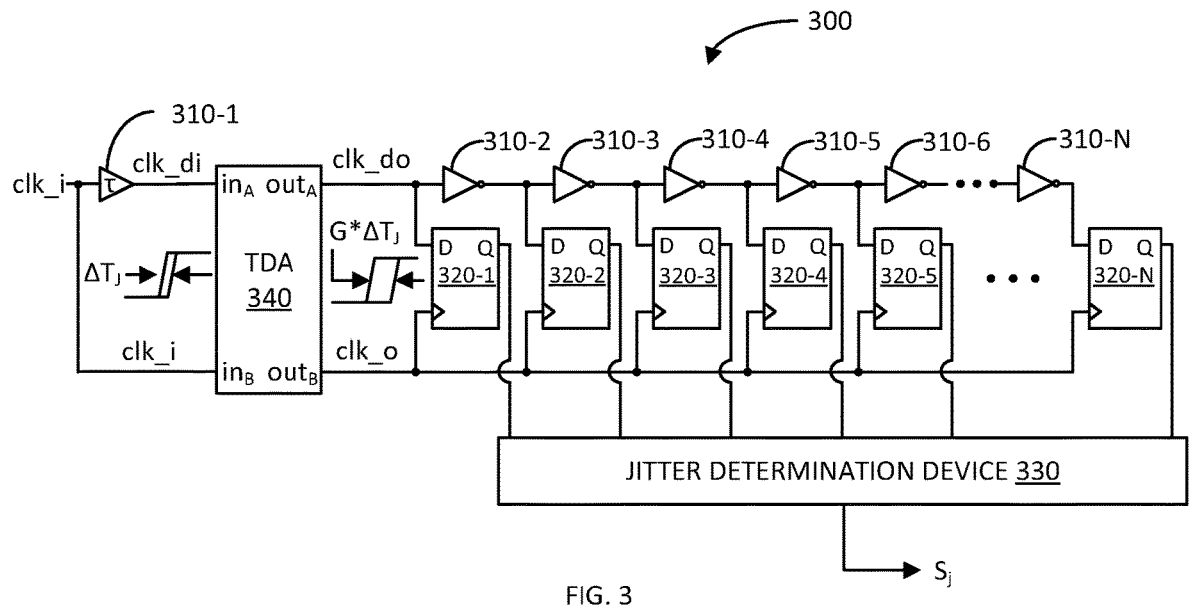
FIG. 3 illustrates a schematic diagram of an exemplary time-to-digital circuit (TDC) with an associated time difference amplifier (TDA) in accordance with another aspect of the disclosure.

FIG. 3 illustrates a schematic diagram of another exemplary time-to-digital circuit (TDC) 300 in accordance with another aspect of the disclosure. Another approach to increasing the resolution of a TDC, without adding significant power consumption and circuit area, is to provide a time difference amplifier (TDA). A TDA amplifies the jitter between two input signals (e.g., a clock and a delayed clock). The resolution of the TDC is increased by the gain of the TDA without the drawbacks of providing significant additional hardware, consuming significant additional power, and scaling by a factor of two flip-flops (e.g., such as in the case of adding a phase generator and another set of flip-flops).

The TDC 300 includes a set of cascaded (series-connected) delay elements, such as delay element 310-1 and inverters 310-2 to 310-N. Similarly, the delay element 310-1 may have a large delay τ as compared to the individual delay of the inverters 310-2 to 310-N, and may itself include a series of cascaded delay elements. The cumulative delay of the set of cascaded delay elements 310-1 to 310-N should be configured to produce a delay substantially equal to the longest statistical clock period. The delay τ of the first delay element 310-1 should be configured to produce a delay substantially equal to the shortest statistical clock period. Accordingly, the cumulative delay provided at substantially the middle of the cascaded delay elements should be set to the statistical mean period of the clock.

The TDC 300 further includes a time difference amplifier (TDA) 340 configured to amplify a jitter of an input clock clk_i. The input clock clk_i is applied to an input of the first delay element 310-1 and a second input $in_B$ of the TDA 340. The first delay element 310-1 is configured to delay the input clock clk_i to generate a delayed input clock clk_di. The delayed input clock clk_di is applied to a first input $in_A$ of the TDA 340. The TDA 340 is configured to generate a delayed output clock clk_do at a first output $out_A$. The TDA 340 is also configured to generate an output clock clk_o at a second output $out_B$.

The TDA 340 is configured amplify a delay $\Delta T_j$ between the closest clocking (e.g., rising) edges of the delayed input clock clk_di and the input clock_i (i.e., the current jitter of the period of the input clock clk_i) to generate an amplified delay $G*\Delta T_j$ between the closest clocking (e.g., rising) edges of the delayed output clock clk_do and the output clock_o (i.e., the amplified current jitter of the period of the input clock clk_i). So, for example, if the delay $\Delta T_j$ between the closest clocking (e.g., rising) edges of the delayed input clock clk_di and the input clock_i is 10 picoseconds (ps), and a gain (G) of the TDA 340 is two (2), then the delay $G*\Delta T_j$ between the closest clocking edges of the output clocks clk_do and clk_o is 20 ps.

The TDC 300 further includes a set of flip-flops 320-1 to 320-N including data inputs (D) coupled to $out_A$ of the TDA 340 and outputs of the set of cascaded delay elements 310-2 to 310-N, respectively. The set of flip-flops 320-1 to 320-N includes clock inputs configured to receive the output clock clk_o generated by the TDA 340 at its $out_B$. The TDC 300 further includes a jitter determination device 330 including inputs coupled to data outputs (Q) of the flip-flops 320-1 to 320-N, respectively. The jitter determination device 330 is configured to generate a jitter measurement signal $S_j$ based on the data at the outputs of the set of flip-flops 320-1 to 320-N.

The operation of the TDC 300 is similar to that of TDC 200 previously discussed. However, in the case of TDC 300, since it includes the TDA 340 to amplify the jitter $\Delta T_j$ of the clock clk_i by a gain (G), the effective resolution of the TDC 300 is substantially the individual delay of the inverters 310-2 to 310-N divided by the gain (G). This solution is more advantageous as the approach that includes a phase generator and another set of flip-flops. For example, the TDA 340 consumes substantially less power than the phase generator and the additional set of flip-flops. TDA 340 requires substantially less circuit area to implement as compared to that of the phase generator and the additional set of flip-flops. Further, scaling the TDC 300 to capture a wider range of jitter is on the order of one flip-flop instead of two as compared to the approach that requires the additional set of flip-flops.

Figure 4:
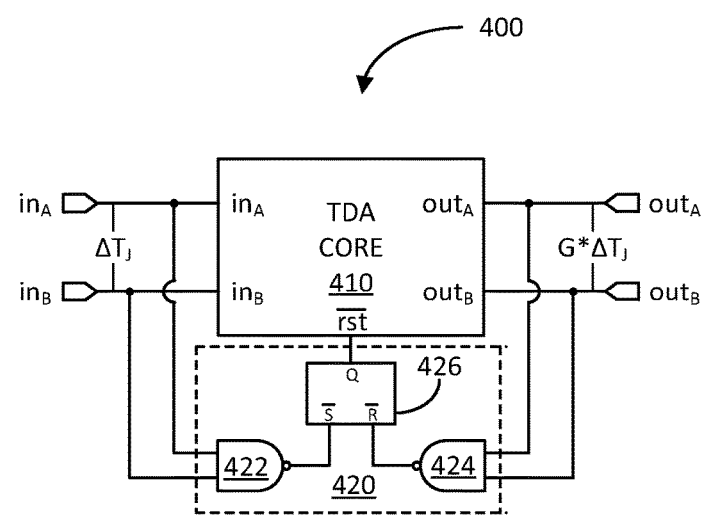
FIG. 4 illustrates a schematic diagram of an exemplary time difference amplifier (TDA) in accordance with another aspect of the disclosure.

FIG. 4 illustrates a schematic diagram of an exemplary time difference amplifier (TDA) 400 in accordance with another aspect of the disclosure. The TDA 400 includes a TDA core 410 and a set/reset circuit 420. The TDA core 410 is configured to amplify a delay $\Delta T_j$ between respective transitions of the same type (e.g., rising) of two input signals $in_A$ and $in_B$ to generate an amplified delay $G*\Delta T_j$ between corresponding transitions of two output signals $out_A$ and $out_B$ per each amplification cycle. Examples of implementations of the TDA core 410 is described further herein.

The set/reset circuit 420 is configured to set the TDA core 410 near a beginning of an amplification cycle, and reset the TDA core 410 near an end of the amplification cycle. The set/reset circuit 420 includes a first NAND gate 422, a second NAND gate 424, and a set/reset (SR) latch 426. The first NAND gate 422 includes inputs configured to receive the input signals $in_A$ and $in_B$, respectively. The second NAND gate 424 includes inputs configured to receive the output signals $out_A$ and $out_B$, respectively. The outputs of the first and second NAND gates 422 and 424 are coupled to complementary set and reset inputs ($\overline{S}$) and ($\overline{R}$) of the SR latch 426. The SR latch 426 includes an output Q configured to generate a complementary reset signal ($\overline{rst}$) for the TDA core 410.

The operation of the set/reset circuit 420 is as follows. When both input signals $in_A$ and $in_B$ transition to high logic levels, the first NAND gate 422 outputs a low logic level. This causes the SR latch 426 to generate the complementary reset signal $\overline{rst}$ at a high logic level. As discussed in more detail herein, the high logic level of the complementary reset signal $\overline{rst}$ prevents the charging of capacitors in delay storage units (DSUs) in the TDA core 410 regardless of the logic state of the input signals $in_A$ and $in_B$. When both output signals $out_A$ and $out_B$ transition to high logic levels, the second NAND gate 424 outputs a low logic level. This causes the SR latch 426 to generate the complementary reset signal $\overline{rst}$ at a low logic level. As discussed in more detail herein, the low logic level of the complementary reset input $\overline{rst}$ causes the capacitors in the DSUs to fully charge to prepare the TDA core 410 for the next amplification cycle.

Figure 5A:
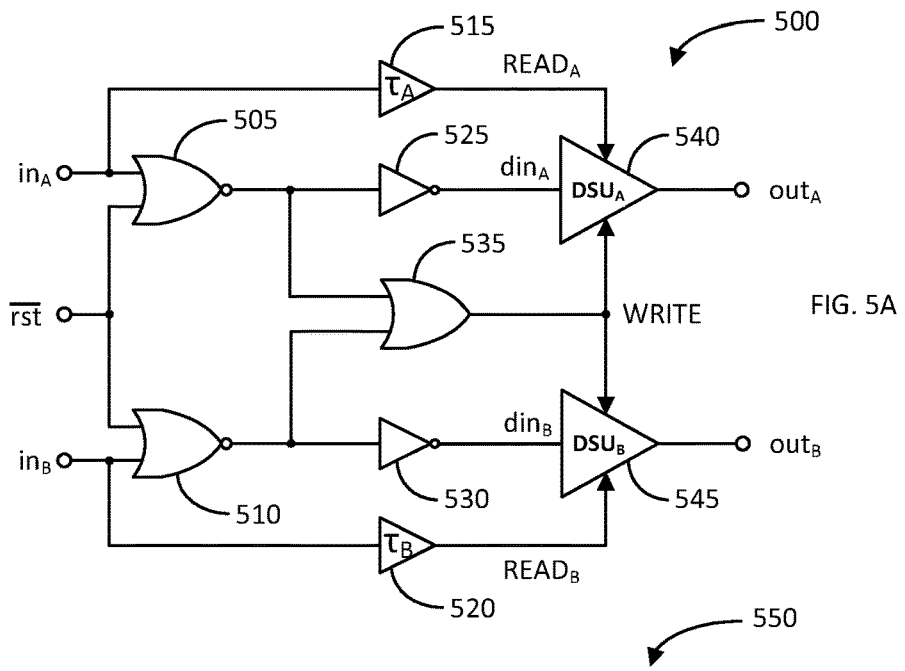
FIG. 5A illustrates a block diagram of an exemplary time difference amplifier (TDA) core in accordance with another aspect of the disclosure.

FIG. 5A illustrates a schematic diagram of an exemplary time difference amplifier (TDA) core 500 in accordance with another aspect of the disclosure. The TDA core 500 includes a first NOR-gate 505, a second NOR-gate 510, a first delay element 515, a second delay element 520, a first inverter 525, a second inverter 530, an OR gate 535, a first $DSU_A$ 540, and a second $DSU_B$ 545.

The first input signal $in_A$ is applied to a first input of the first NOR gate 505, and to an input of the first delay element 515. The second input signal $in_B$ is applied to a first input of the second NOR gate 510, and to an input of the second delay element 520. The complementary reset signal $\overline{rst}$ is applied to second inputs of the first and second NOR gates 505 and 510, respectively. The first NOR gate 505 includes an output coupled to an input of the first inverter 525 and to a first input of the OR gate 535. The second NOR gate 510 includes an output coupled to an input of the second inverter 530 and to a second input of the OR gate 535.

The first inverter 525, which is configured to generate a first DSU input signal $din_A$, includes an output coupled to a first input of the first $DSU_A$ 540. The second inverter 530, which is configured to generate a second DSU input signal $din_B$, includes an output coupled to a first input of the second $DSU_B$ 545.

The first delay element 515, which may be a non-inverting delay element, is configured to generate a first $READ_A$ signal at an output coupled to a second input of the first $DSU_A$ 540. The first delay element 515 is configured to delay the first input signal $in_A$ by a substantially fixed delay $\tau_A$, which may be programmable for calibration or other purposes. The first delay element 515 may include a set of cascaded buffers, a set of cascaded inverters, or any combination thereof.

The second delay element 520, which may be a non-inverting delay element, is configured to generate a second $READ_B$ signal at an output coupled to a second input of the second $DSU_B$ 545. The second delay element 520 is configured to delay the second input signal $in_B$ by a substantially fixed delay $\tau_B$, which may be programmable for calibration or other purposes. The second delay element 520 may include a set of cascaded buffers, a set of cascaded inverters, or any combination thereof. The delay $\tau_B$ of the second delay element 520 may be set to be substantially the same as the delay $\tau_A$ of the first delay element 515.

The OR gate 535 is configured to generate a WRITE signal at an output coupled to third inputs of the first $DSU_A$ 540 and the second $DSU_B$ 545, respectively. The first $DSU_A$ 540 is configured to generate the first output signal $out_A$. The second $DSU_B$ 545 is configured to generate the second output signal $out_B$.

Figure 5B:
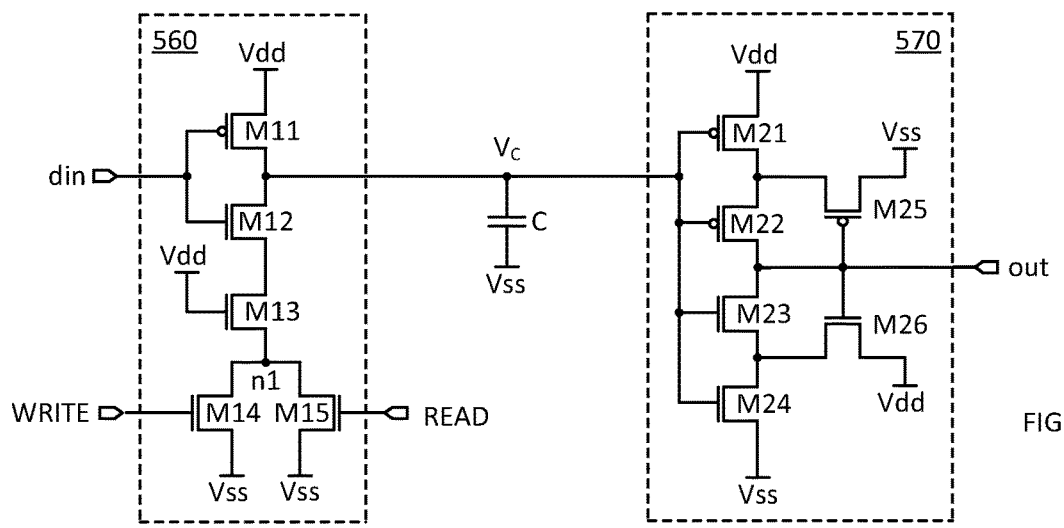
FIG. 5B illustrates a schematic diagram of an exemplary delay storage unit (DSU) in accordance with another aspect of the disclosure.

FIG. 5B illustrates a schematic diagram of an exemplary delay storage unit (DSU) 550 in accordance with another aspect of the disclosure. The DSU 550 may be an exemplary detailed implementation of any of the $DSU_A$ 540 and $DSU_B$ 545 previously discussed. Accordingly, signals din, WRITE, READ, and out correspond to signals $din_A/din_B$, WRITE, $READ_A/READ_B$, and $out_A/out_B$ in $DSU_A/DSU_B$, respectively. The DSU 550 includes a charging/discharging circuit 560, a capacitor C, and a comparator 570.

The charging/discharging circuit 560 includes a p-channel metal oxide semiconductor field effect transistor (PMOS FET or "PMOS" for short) M11, an n-channel metal oxide semiconductor field effect transistor (NMOS FET or "NMOS" for short) M12, and NMOSs M13, M14, and M15. The PMOS M11 and NMOSs M12 and M13 are coupled in series in that order between an upper voltage rail Vdd and an intermediate node n1. The PMOS M11 and NMOS M12 include gates coupled together and configured to receive the corresponding DSU input signal din. The PMOS M11 and NMOS M12 include drains coupled together and to a first terminal of the capacitor C; a second terminal of the capacitor C being coupled to a lower voltage rail Vss (e.g, ground).

The NMOS M13 includes a gate coupled to the upper voltage rail Vdd. The NMOSs M14 and M15 are coupled in parallel between the intermediate node n1 and the lower voltage rail Vss. The NMOS M14 includes a gate configured to receive the WRITE signal. The NMOS M15 includes a gate configured to receive the READ signal.

The comparator 570, in this example, is configured as a Schmidt trigger for reasons further discussed herein, but may optionally be configured as an inverter. The comparator 570 includes PMOSs M21, M22, and M25, and NMOSs M23, M24, and M26. The PMOSs M21 and M22 and NMOSs M23 and M24 are coupled in series between the upper voltage rail Vdd and the lower voltage rail Vss. The PMOSs M21 and M22 and NMOSs M23 and M24 include gates coupled together and to the first terminal of the capacitor C. The PMOS M25 is coupled between the drain of PMOS M21 and the lower voltage rail Vss. The NMOS M26 is coupled between the upper voltage rail Vdd and the drain of NMOS M24. The PMOS M25 and NMOS M26 include gates coupled together and to the drains of PMOS M22 and NMOS M23 to form an output of the DSU 550, at which the corresponding output signal out is generated.

If, the comparator 570 is configured as an inverter, the reference voltage $V_{ref}$ that governs whether the output is high or low is set to substantially halfway between the upper supply voltage Vdd and the lower supply voltage Vss ($V_{ref}$=0.5*(Vdd-Vss)). When a voltage $V_C$ at the first terminal of capacitor C decreases from substantially Vdd (fully charged) towards Vss due to a discharging of the capacitor C, the inverter-type comparator 570 switches the state of the output signal out from low to high when the voltage $V_C$ crosses and falls below the reference voltage $V_{ref}$. Thus, with an inverter-type comparator 570, the dynamic range of the voltage $V_C$ is 0.5*Vdd (assuming Vss is ground at 0 Volt).

In the case of the comparator 570 being configured as a Schmidt trigger, there are two reference voltages: an upper reference voltage $V_{ref1}$ and a lower reference voltage $V_{ref2}$. The upper and lower reference voltages $V_{ref1}$ and $V_{ref2}$ are typically set to 0.67*(Vdd-Vss) and 0.33*(Vdd-Vss), respectively. When the voltage $V_C$ decreases from substantially Vdd towards Vss due to a discharging of the capacitor C, the Schmidt trigger comparator 570 switches the state of the output signal out from low to high when the voltage $V_C$ crosses and falls below the lower reference voltage $V_{ref2}$. Thus, with a Schmidt trigger comparator 570, the dynamic range of the voltage $V_C$ is (1-0.33)*Vdd or 0.67*Vdd (assuming Vss is ground at 0 Volt). Thus, the dynamic range of the voltage $V_C$ is much larger; thereby, allowing the TDA core 500 to amplify a larger range of input jitter delay $\Delta T_j$. In this example, the upper reference voltage $V_{ref1}$ is not as relevant as the voltage $V_C$ is just reset back to Vdd after the completion of an amplification cycle.

Figure 5C:
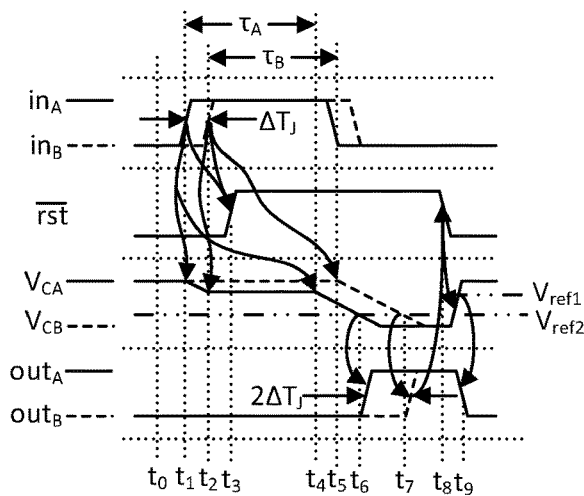
FIG. 5C illustrates a timing diagram of an exemplary operation of a time difference amplifier (TDA) core in accordance with another aspect of the disclosure.

FIG. 5C illustrates a timing diagram of an exemplary operation of the TDA core 500 in accordance with another aspect of the disclosure. The timing diagram illustrates the state or amplitude of the signals associated with the TDA core 500 during a complete amplification cycle. From top to bottom, the signals are the first input signal $in_A$, the second input signal $in_B$, the complementary reset signal $\overline{rst}$, a voltage $V_{CA}$ at the first terminal of capacitor C in the first $DSU_A$ 540, a voltage $V_{CB}$ at the first terminal of capacitor C in the second $DSU_B$ 545, the first output signal $out_A$, and the second output signal $out_B$.

With further reference to FIGS. 4 and 5A-5B, at time $t_0$ at beginning of an amplification cycle, the input signals $in_A$ and $in_B$ are at low logic levels (e.g., Vss). In response to these levels, the set/reset circuit 420 generates the complementary reset signal $\overline{rst}$ are at a low logic level. Based on these low logic levels, the first and second NOR gates 505 and 510 generate high logic levels (e.g., Vdd). In response, the first and second inverters 525 and 530 generate the DSU input signals $din_A$ and $din_B$ at low logic levels. Also, the OR gate 535 generates the WRITE signal at a high logic level.

Additionally, the first and second delay elements 515 and 520 generate the $READ_A$ and $READ_B$ signals at low logic levels, respectively.

With particular reference to FIG. 5B, the DSU input signal din (of each of the DSUs 540 and 545) being at a low logic level causes the PMOS M11 to turn on and the NMOS M12 to turn off. The turned on PMOS M11 couples the upper voltage rail Vdd to the first terminal of the capacitor C; thereby, fully charging the capacitor C. With particular reference to FIG. 5C, at time $t_0$, the voltages $V_{CA}$ and $V_{CB}$ at the first terminals of the corresponding capacitors C in DSUs 540 and 545 are at substantially the supply voltage Vdd. The voltages $V_{CA}$ and $V_{CB}$ being at substantially Vdd (e.g., above the lower reference voltage $V_{ref2}$) causes the comparator 570 to generate the output signals $out_A$ and $out_B$ at low logic levels. The corresponding READ signal being at a low logic level causes NMOS M15 to be off. And the corresponding WRITE signal being at a high logic level causes NMOS M15 to be on.

At time $t_1$, in this example, the first input signal $in_A$ transitions to a high logic level. However, it shall be understood that the second input signal $in_B$ may be the first one to transition to a high logic level. The first input signal $in_A$ transitioning to a high logic level initiates the write phase of the amplification cycle. In response to the input signal $in_A$ transitioning to a high logic level, the first NOR gate 505 generates a low logic level. The first inverter 525, in turn, generates the DSU input signal $din_A$ at a high logic level. With particular reference to FIG. 5B, the high logic level of $din_A$ causes the PMOS M11 to turn off and the NMOS M12 to turn on. Accordingly, the charging/discharging circuit 560 forms a current path between the first terminal of the capacitor C and the lower voltage rail Vss via NMOSs M12, M13, and M14 to begin discharging the capacitor C. With particular reference to FIG. 5C, the voltage $V_{CA}$ at the first terminal of capacitor C begins to decrease at time $t_1$.

At time $t_2$, the input signal $in_B$ transitions to a high logic level. The difference between times $t_1$ and $t_2$ is the delay $\Delta T_j$ between the rising transitions of the input signals $in_A$ and $in_B$, respectively. In response to the input signal $in_B$ transitioning to a high logic level, the second NOR gate 510 generates a low logic level. As both inputs to the OR gate 535 are at low logic levels, the OR gate 535 generates the WRITE signal at a low logic level. With particular reference to FIG. 5B and with respect to the first $DSU_A$ 540, the WRITE signal being at a low logic level turns off NMOS M14; thereby, substantially eliminating the current path between the first terminal of the capacitor C and the lower voltage rail Vss. With particular reference to FIG. 5C, the voltage $V_{CA}$ at the first terminal of capacitor C stops decreasing at time $t_2$. At this time, the voltage $V_{CA}$ has not decreased below the lower reference voltage $V_{ref2}$ of the comparator 570; thereby, the comparator 570 maintains the output signal $out_A$ at a low logic level. This completes the write phase of the amplification cycle as the delay $\Delta T_j$ has been written into the $DSU_A$ 540 in the form of a decrease in the voltage $V_{CA}$ at the first terminal of capacitor C.

With regard to the second $DSU_B$ 545, at time $t_2$, the DSU input $din_B$ is at high logic level, the $READ_B$ signal is at a low logic level, and the WRITE signal is also at a low logic level. With particular reference to FIG. 5B, the DSU input $din_B$ being at a high logic level causes the PMOS M11 to turn off. However, as both the WRITE and $READ_B$ signals are at low logic levels, the NMOSs M14 and M15 are turned off; thus, there is no current path to discharge the capacitor C. Thus, the voltage $V_{CB}$ at the first terminal of capacitor C remains at substantially Vdd. The delay between the input of the TDA core 500 and the corresponding DSU input may be set larger than the delay between the input of the TDA core 500 and the WRITE input of the corresponding DSU so as to prevent a discharge of the capacitor C if the input signal din arrives before the WRITE signal (e.g., turning on M12 while M14 is still turned on; thereby forming a current path between the first terminal of the capacitor C and Vss).

With particular reference to FIG. 4, as both input signals $in_A$ and $in_B$ are at high logic levels, the set/reset circuit 420 generates the complementary reset signal $\overline{rst}$ at a high logic level at time $t_3$. The complementary reset signal $\overline{rst}$ remains at a high logic level until both output signals $out_A$ and $out_B$ transition to high logic levels near the end of the amplification cycle. The complementary reset signal $\overline{rst}$ remains at a high logic level to prevent the charging/discharging circuit 560 to charge the corresponding capacitor C when the corresponding input signals $in_A$ and $in_B$ transition back to low logic levels (because the $din_A$ and $din_B$ remain high while $\overline{rst}$ remains high).

At time $t_4$, after the fixed delay $\tau_A$ from time $t_1$, the first delay element 510 causes the $READ_A$ signal to transition to a high logic level. This initiates the read phase of the amplification cycle. With particular reference to FIG. 5B, the $READ_A$ signal transitioning to a high logic level causes the charging/discharging circuit 560 in $DSU_A$ 540 to restart the discharging of the capacitor C; thus, the voltage $V_{CA}$ at the first terminal of capacitor C begins to decrease again. This is because the $READ_A$ signal being high turns on NMOS FET M15; thereby, producing a current path between the first terminal of the capacitor C and the lower voltage rail Vss via NMOSs M12, M13, and M15.

Similarly, at time $t_5$, after the fixed delay $\tau_B$ from time $t_2$, the second delay element 520 causes the $READ_B$ signal to transition to a high logic level. With particular reference to FIG. 5B, the $READ_B$ signal transitioning to a high logic level causes the charging/discharging circuit 560 in $DSU_B$ 545 to start the discharging of the capacitor C; thus, the voltage $V_{CB}$ at the first terminal of capacitor C begins to decrease. This is because the $READ_B$ signal being high turns on NMOS FET M15; thereby, producing a current path between the first terminal of the capacitor C and the lower voltage rail Vss via NMOSs M12, M13, and M15.

At time $t_6$, the voltage $V_{CA}$ at the first terminal of capacitor C crosses and falls below the lower reference voltage $V_{ref2}$ of the corresponding comparator 570 of the first $DSU_A$ 540. In response, the corresponding comparator 570 generates the output signal $out_A$ at a high logic level. Similarly, at time $t_7$, the voltage $V_{CB}$ at the first terminal of capacitor C crosses and falls below the lower reference voltage $V_{ref2}$ of the corresponding comparator 570 of the second $DSU_B$ 545. In response, the corresponding comparator 570 generates the output signal $out_B$ at a high logic level. This ends the read phase of the amplification cycle.

The time difference $t_7$-$t_6$ between the rising transitions of the output signals $out_B$ and $out_A$ is the amplified delay $2*\Delta T_j$, where, in this example, the gain (G) is two (2). In essence, the amplified delay $2*\Delta T_j$ is formed by the delay $\Delta T_j$ ($t_2$-$t_1$) stored in the $DSU_A$ 540 during the write phase of the amplification cycle, and the additional delay $\Delta T_j$ ($t_5$-$t_4$) in reading the delay from the $DSU_A$ 540.

With particular reference to FIG. 4, as both the output signals $out_A$ and $out_B$ are at high logic levels at time $t_7$, the set/reset circuit 420 causes the complementary reset signal $\overline{rst}$ to transition to a low logic level at time $t_8$. This begins the preparation of the TDA core 500 for the next amplification cycle. With particular reference to FIG. 5A, the complementary reset signal $\overline{rst}$ transitioning to a low logic level causes the first and second NOR gates 505 and 510 to output high logic levels (as the input signals $in_A$ and $in_B$ have previously transitioned to low logic levels). In response, the first and second inverters 525 and 530 generate the DSU input signals $din_A$ and $din_B$ at low logic levels, respectively.

With particular reference to FIG. 5B, the DSU input signals $din_A$ and $din_B$ being at low logic levels causes the corresponding PMOS FETs M11 and NMOS FETs M12 to turn on and off, respectively. This causes charging/discharging circuit 560 to fully charges the capacitors C in the DSUs 540 and 545; thus, the voltages $V_{CA}$ and $V_{CB}$ rise above the upper reference voltage $V_{ref1}$; thereby, causing the corresponding comparators 570 to generate the output signals $out_A$ and $out_B$ at low logic levels at time $t_9$. Thus, the state of the TDA core 500 is brought back to the state at the beginning of the next amplification cycle.

Figure 6A:
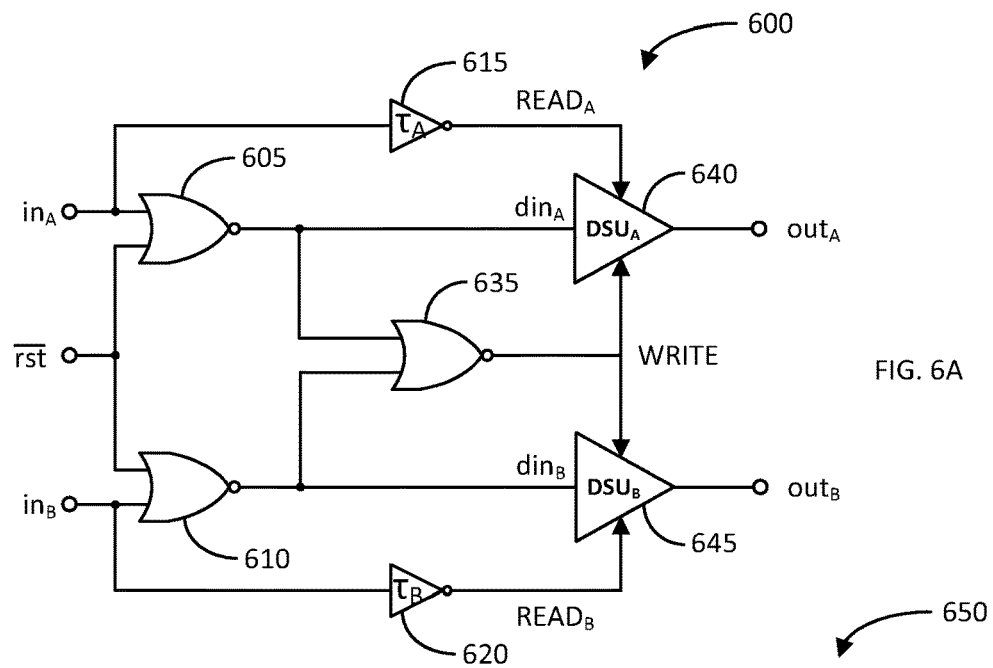
FIG. 6A illustrates a schematic diagram of another exemplary time difference amplifier (TDA) core in accordance with another aspect of the disclosure.

FIG. 6A illustrates a schematic diagram of another exemplary time difference amplifier (TDA) core 600 in accordance with another aspect of the disclosure. In summary, the TDA core 600 includes DSUs that use complementary transistors as those used in the DSUs of TDA core 500. Because of the complementary transistors used in the DSUs, the TDA core 600 includes a logic circuit different than that of TDA core 500 to operate appropriately with the DSUs, as further discussed further herein. In particular, the TDA 600 includes a first NOR-gate 605, a second NOR-gate 610, a first delay element 615, a second delay element 620, a NOR gate 635, a first $DSU_A$ 640, and a second $DSU_B$ 645.

The first input signal $in_A$ is applied to a first input of the first NOR gate 605, and to an input of the first delay element 615. The second input signal $in_B$ is applied to a first input of the second NOR gate 610, and to an input of the second delay element 620. The complementary reset signal $\overline{rst}$ is applied to second inputs of the first and second NOR gates 605 and 610, respectively. The first NOR gate 605 is configured to generate first DSU input signal $din_A$ at an output coupled to a first input a first $DSU_A$ 640 and to a first input of the NOR gate 635. The second NOR gate 610 is configured to generate a second DSU input signal $din_B$ at an output coupled to a first input of the second $DSU_B$ 645 and to a second input of the NOR gate 635.

The first delay element 615, which may be an inverting delay element, is configured to generate a first $READ_A$ signal at an output coupled to a second input of the first $DSU_A$ 640. The first delay element 615 is configured to delay the first input signal $in_A$ by a substantially fixed delay $\tau_A$, which may be programmable for calibration or other purposes. The first delay element 615 may include a set of cascaded buffers, a set of cascaded inverters, or any combination thereof.

The second delay element 620, which may be an inverting delay element, is configured to generate a second $READ_B$ signal at an output coupled to a second input of the second $DSU_B$ 645. The second delay element 620 is configured to delay the second input signal $in_B$ by a substantially fixed delay $\tau_B$, which may be programmable for calibration or other purposes. The second delay element 620 may include a set of cascaded buffers, a set of cascaded inverters, or any combination thereof. The delay $\tau_B$ of the second delay element 620 may be set to be substantially the same as the delay $\tau_A$ of the first delay element 615.

The NOR gate 635 is configured to generate a WRITE signal at an output coupled to third inputs of the first $DSU_A$ 640 and the second $DSU_B$ 645, respectively. The first $DSU_A$ 640 is configured to generate the first output signal $out_A$. The second $DSU_B$ 645 is configured to generate the second output signal $out_B$.

Figure 6B:
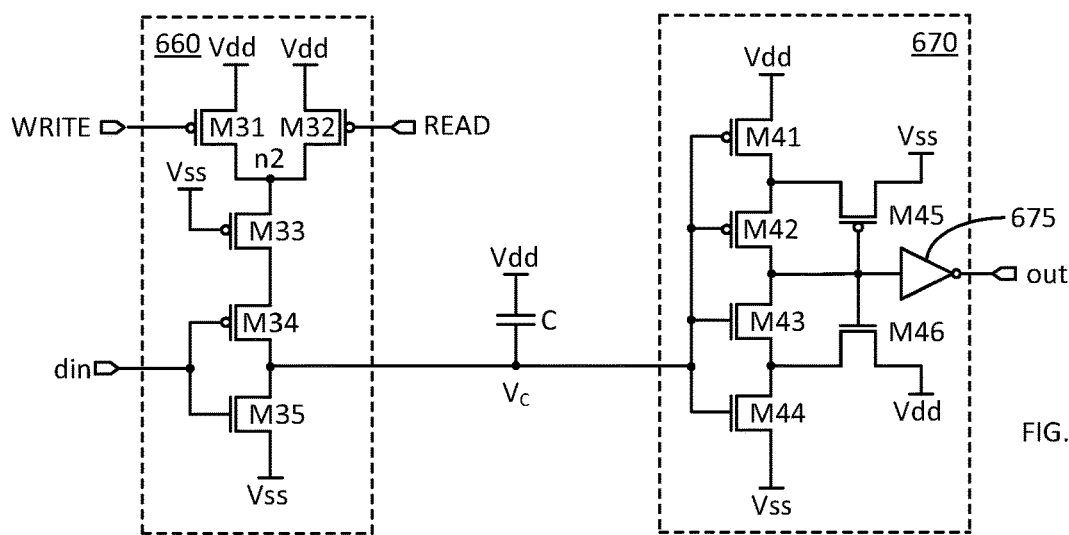
FIG. 6B illustrates a schematic diagram of another exemplary delay storage unit (DSU) in accordance with another aspect of the disclosure.

FIG. 6B illustrates a schematic diagram of an exemplary delay storage unit (DSU) 650 in accordance with another aspect of the disclosure. The DSU 650 may be an exemplary detailed implementation of any of the $DSU_A$ 640 and $DSU_B$ 645 previously discussed. Accordingly, signals din, WRITE, READ, and out correspond to signals $din_A/din_B$, WRITE, $READ_A/READ_B$, and $out_A/out_B$ in $DSU_A/DSU_B$, respectively. The DSU 650 includes a charging/discharging circuit 660, a capacitor C, and a comparator 670.

The charging/discharging circuit 660 includes PMOSs M31 and M32 coupled in parallel between the upper voltage rail Vdd and an intermediate node n2. The PMOS M31 includes a gate configured to receive the WRITE signal. The PMOS M32 includes a gate configured to receive the READ signal. The charging/discharging circuit 660 includes PMOSs M33 and M34, and NMOS M35 coupled in series between the intermediate node n2 and the lower voltage rail Vss. The PMOS M33 includes a gate coupled to the lower voltage rail Vss. The PMOS M34 and NMOS M35 include gates coupled together and configured to receive the corresponding DSU input signal din. The PMOS M34 and NMOS M35 include drains coupled together and to a first terminal of the capacitor C; a second terminal of the capacitor C being coupled to the upper voltage rail Vdd.

The comparator 670, in this example, is configured as a Schmidt trigger for similar reasons previously discussed with reference to comparator 570. However, it shall be understood that the comparator 670 may be configured as a pair of cascaded inverters. The comparator 670 includes PMOSs M41, M42, and M45, NMOSs M43, M44, and M46, and an inverter 675. The PMOSs M41 and M42 and NMOSs M43 and M44 are coupled in series between the upper voltage rail Vdd and the lower voltage rail Vss. The PMOSs M41 and M42 and NMOSs M43 and M44 include gates coupled together and to the first terminal of the capacitor C. The PMOS M45 is coupled between the drain of PMOS M41 and the lower voltage rail Vss. The NMOS M46 is coupled between the upper voltage rail Vdd and the drain of NMOS M44. The PMOS M45 and NMOS M46 include gates coupled together, to the drains of PMOS M42 and NMOS M43, and to an input of the inverter 675. The inverter 675 is configured to generate the output signal out of the DSU 650.

If, the comparator 670 is configured as a pair of cascaded inverters, the reference voltage $V_{ref}$ that governs whether the output is high or low is set to substantially halfway between the upper supply voltage Vdd and the lower supply voltage Vss ($V_{ref}=0.5*(Vdd-Vss)$). When a voltage $V_C$ at the first terminal of capacitor C increases from substantially Vss (fully charged) towards Vdd due to a discharging of the capacitor C, the inverter-type comparator 670 switches the state of the output signal out from low to high when the voltage $V_C$ crosses and rises above the reference voltage $V_{ref}$. Thus, with an inverter-type comparator 670, the dynamic range of the voltage $V_C$ is $0.5*Vdd$ (assuming Vss is ground at 0 Volt).

In the case of the comparator 670 being configured as a Schmidt trigger, there are two reference voltages: an upper reference voltage $Vref_1$ and a lower reference voltage $V_{ref2}$. The upper and lower reference voltages $V_{ref1}$ and $V_{ref2}$ are typically set to $0.67*(Vdd-Vss)$ and $0.33*(Vdd-Vss)$, respectively. When the voltage $V_C$ increases from substantially Vss towards Vdd due to a discharging of the capacitor C, the Schmidt trigger comparator 670 switches the state of the output signal out from low to high when the voltage $V_C$ crosses and rises above the upper reference voltage $V_{ref1}$. Thus, with a Schmidt trigger comparator 670, the dynamic range of the voltage $V_C$ is $0.67*Vdd$ (assuming Vss is ground at 0 Volt). Thus, the dynamic range of the voltage $V_C$ is much larger; thereby, allowing the TDA core 600 to amplify a larger range of input jitter delay $\Delta T_j$. In this example, the lower reference voltage $V_{ref2}$ is not as relevant as the voltage $V_C$ is just reset back to Vss after the completion of an amplification cycle.

Figure 6C:
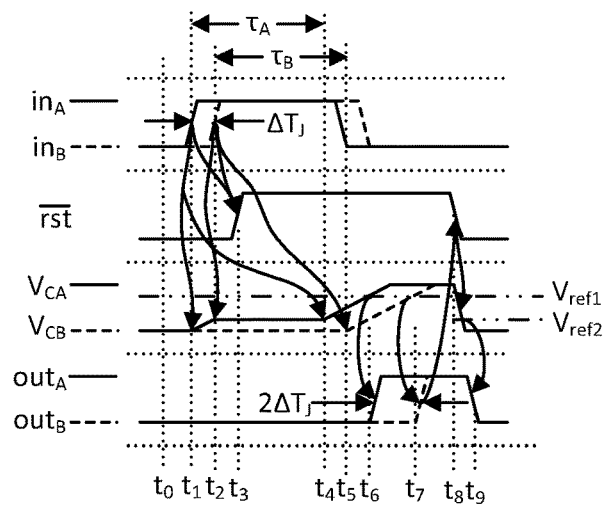
FIG. 6C illustrates a timing diagram of another exemplary operation of a time difference amplifier (TDA) core in accordance with another aspect of the disclosure.

FIG. 6C illustrates a timing diagram of an exemplary operation of the TDA core 600 in accordance with another aspect of the disclosure. The timing diagram illustrates the state or amplitude of the signals associated with the TDA core 600 during a complete amplification cycle. From top to bottom, the signals are the first input signal $in_A$, the second input signal $in_B$, the complementary reset signal $\overline{rst}$, a voltage $V_{CA}$ at the first terminal of the capacitor C in the first $DSU_A$ 640, a voltage $V_{CB}$ at the first terminal of the capacitor C in the second $DSU_B$ 645, the first output signal $out_A$, and the second output signal $out_B$.

With further reference to FIGS. 4 and 6A-6B, at time $t_0$ at beginning of an amplification cycle, the input signals $in_A$ and $in_B$ are at low logic levels (e.g., Vss). In response to these levels, the set/reset circuit 420 generates the complementary reset signal $\overline{rst}$ are at a low logic level. Based on these low logic levels, the first and second NOR gates 605 and 610 generate high logic levels (e.g., Vdd). Accordingly, the DSU input signals $din_A$ and $din_B$ are at high logic levels. Also, in response, the NOR gate 635 generates the WRITE signal at a low logic level. Additionally, the first and second delay elements 615 and 620 generate the $READ_A$ and $READ_B$ signals at high logic levels, respectively.

With particular reference to FIG. 6B, the DSU input signal din (of each of the DSUs 640 and 645) being at a high logic level causes the PMOS M34 to turn off and the NMOS M35 to turn on. The turned on NMOS M35 couples the first terminal of the capacitor C to the lower voltage rail Vss; thereby, fully charging the capacitor C (e.g., a potential Vdd is applied across the capacitor C). With particular reference to FIG. 6C, at time $t_0$, the voltages $V_{CA}$ and $V_{O3}$ at the first terminal of the corresponding capacitors C in DSUs 640 and 645 are at substantially the lower rail voltage Vss (e.g., ground or 0V). The voltages $V_{CA}$ and $V_{CB}$ being at substantially Vss (e.g., below the upper reference voltage $Vref_1$) causes the comparator 670 to generate the output signals $out_A$ and $out_B$ at low logic levels. The corresponding READ signal being at a high logic level causes PMOS M32 to be off. And the corresponding WRITE signal being at a low logic level causes NMOS M15 to be on.

At time $t_1$, in this example, the first input signal $in_A$ transitions to a high logic level. As in the previous implementation, it shall be understood that the second input signal $in_B$ may be the first one to transition to a high logic level. The first input signal $in_A$ transitioning to a high logic level initiates the write phase of the amplification cycle. In response to the input signal $in_A$ transitioning to a high logic level, the first NOR gate 605 generates a low logic level. Accordingly, the DSU input signal $din_A$ at a low logic level. With particular reference to FIG. 6B, the low logic level of $din_A$ causes the PMOS M34 to turn on and the NMOS M35 to turn off. Accordingly, the charging/discharging circuit 660 forms a current path between the first terminal of the capacitor C and the upper voltage rail Vdd via PMOSs M34, M33, and M31 to begin discharging the capacitor C. With particular reference to FIG. 6C, the voltage $V_{CA}$ at the first terminal of the capacitor C begins to increase at time $t_1$.

At time $t_2$, the input signal $in_B$ transitions to a high logic level. The difference between times $t_1$ and $t_2$ is the delay $\Delta T_j$ between the rising transitions of the input signals $in_A$ and $in_B$, respectively. In response to the input signal $in_B$ transitioning to a high logic level, the second NOR gate 610 generates a low logic level. As both inputs to the NOR gate 635 are at low logic levels, the NOR gate 635 generates the WRITE signal at a high logic level. With particular reference to FIG. 6B and with respect to the first $DSU_A$ 640, the WRITE signal being at a high logic level turns off PMOS M31; thereby, substantially eliminating the current path between the first terminal of the capacitor C and the upper voltage rail Vdd. With particular reference to FIG. 6C, the voltage $V_{CA}$ at the first terminal of the capacitor C stops increasing at time $t_2$. At this time, the voltage $V_{CA}$ has not increased above the upper reference voltage $V_{ref1}$ of the comparator 670; thereby, the comparator 670 maintains the output signal $out_A$ at a low logic level. This completes the write phase of the amplification cycle as the delay $\Delta T_j$ has been written into the $DSU_A$ 640 in the form of an increase in the voltage $V_{CA}$ at the first terminal of the capacitor C.

With regard to the second $DSU_B$ 645, at time $t_2$, the DSU input $din_B$ is at low logic level, the $READ_B$ signal is at a high logic level, and the WRITE signal is also at a high logic level. With particular reference to FIG. 6B, the DSU input $din_B$ being at a low logic level causes the NMOS M35 to turn off. However, as both the WRITE and $READ_B$ signals are at high logic levels, the PMOSs M31 and M32 are turned off; thus, there is no current path to discharge the capacitor C. Thus, the voltage $V_{CB}$ at the first terminal of the capacitor C remains at substantially Vss. The delay between the input of the TDA core 600 and the corresponding DSU input may be set larger than the delay between the input of the TDA core 600 and the WRITE input of the corresponding DSU so as to prevent a discharge of the capacitor C if the input signal din arrives before the WRITE signal (e.g., turning on M34 while M31 is still turned on; thereby forming a current path between the first terminal of the capacitor C and Vdd).

With particular reference to FIG. 4, as both input signals $in_A$ and $in_B$ are at high logic levels, the set/reset circuit 420 generates the complementary reset signal $\overline{rst}$ at a high logic level at time $t_3$. The complementary reset signal $\overline{rst}$ remains at a high logic level until both output signals $out_A$ and $out_B$ transition to high logic levels near the end of the amplification cycle. The complementary reset signal $\overline{rst}$ remains at a high logic level to prevent the charging/discharging circuit 660 to charge the corresponding capacitor C when the corresponding input signals $in_A$ and $in_B$ transition back to low logic levels (because the $din_A$ and $din_B$ remain low while $\overline{rst}$ remains high).

At time $t_4$, after the fixed delay $\tau_A$ from time $t_1$, the first delay element 610 causes the $READ_A$ signal to transition to a low logic level. This initiates the read phase of the amplification cycle. With particular reference to FIG. 6B, the $READ_A$ signal transitioning to a low logic level causes the charging/discharging circuit 660 in $DSU_A$ 640 to restart the discharging of the capacitor C; thus, the voltage $V_{CA}$ at the first terminal of the capacitor C begins to increase again. This is because the $READ_A$ signal being low turns on PMOS FET M32; thereby, producing a current path between the first terminal of the capacitor C and the upper voltage rail Vdd via PMOSs M34, M33, and M32.

Similarly, at time $t_5$, after the fixed delay $\tau_B$ from time $t_2$, the second delay element 620 causes the $READ_B$ signal to transition to a low logic level. With particular reference to FIG. 6B, the $READ_B$ signal transitioning to a low logic level causes the charging/discharging circuit 660 in $DSU_B$ 640 to start the discharging of the capacitor C; thus, the voltage $V_{CB}$ at the first terminal of the capacitor C begins to increase. This is because the $READ_B$ signal being low turns on PMOS FET M32; thereby, producing a current path between the first terminal of the capacitor C and the upper voltage rail Vdd via PMOSs M34, M33, and M32.

At time $t_6$, the voltage $V_{CA}$ at the first terminal of the capacitor C crosses and rises above the upper reference voltage $V_{ref1}$ of the corresponding comparator 670 of the first $DSU_A$ 640. In response, the corresponding comparator 670 generates the output signal $out_A$ at a high logic level. Similarly, at time $t_7$, the voltage $V_{CB}$ at the first terminal of the capacitor C crosses and rises above the upper reference voltage $V_{ref1}$ of the corresponding comparator 670 of the second $DSU_B$ 640. In response, the corresponding comparator 670 generates the output signal $out_B$ at a high logic level. This ends the read phase of the amplification cycle.

The time difference $t_7$-$t_6$ between the rising transitions of the output signals $out_B$ and $out_A$ is the amplified delay $2*\Delta T_j$, where, in this example, the gain (G) is two (2). In essence, the amplified delay $2*\Delta T_j$ is formed by the delay $\Delta T_j$ ($t_2$-$t_1$) stored in the $DSU_A$ 640 during the write phase of the amplification cycle, and the additional delay $\Delta T_j$ ($t_5$-$t_4$) in reading the delay from the $DSU_A$ 640.

With particular reference to FIG. 4, as both the output signals $out_A$ and $out_B$ are at high logic levels at time $t_7$, the set/reset circuit 420 causes the complementary reset signal $\overline{rst}$ to transition to a low logic level at time $t_8$. This begins the preparation of the TDA core 600 for the next amplification cycle. With particular reference to FIG. 6A, the complementary reset signal $\overline{rst}$ transitioning to a low logic level causes the first and second NOR gates 605 and 610 to output high logic levels (as the input signals $in_A$ and $in_B$ have previously transitioned to low logic levels). Accordingly, the DSU input signals $din_A$ and $din_B$ at high logic levels, respectively.

With particular reference to FIG. 6B, the DSU input signals $din_A$ and $din_B$ being at high logic levels causes the corresponding PMOS FETs M34 and NMOS FETs M35 to turn off and on, respectively. This causes charging/discharging circuit 660 to fully charge the capacitors C in the DSUs 640 and 650; thus, the voltages $V_{CA}$ and $V_{CB}$ fall below the lower reference voltage $V_{ref2}$; thereby, causing the corresponding comparators 670 to generate the output signals $out_A$ and $out_B$ to low logic levels at time $t_9$. Thus, the state of the TDA core 600 is brought back to the state at the beginning of the next amplification cycle.

Figure 7A:
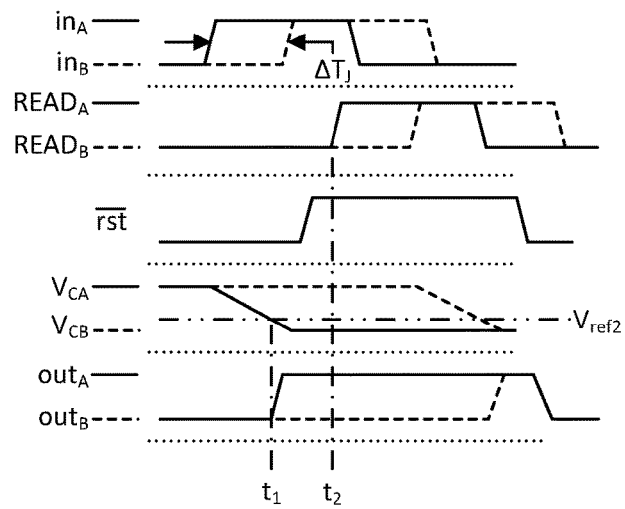
FIG. 7A illustrates a timing diagram of an exemplary operation of a time difference amplifier (TDA) undergoing saturation in accordance with another aspect of the disclosure.

FIG. 7A illustrates a timing diagram of an exemplary operation of the time difference amplifier (TDA) core 500 undergoing saturation in accordance with another aspect of the disclosure. The timing diagram illustrates the state or amplitude of the signals associated with the TDA core 500. From top to bottom, the signals are the first input signal $in_A$, the second input signal $in_B$, the first $READ_A$ signal, the second $READ_B$ signal, the complementary reset signal $\overline{rst}$, a voltage $V_{CA}$ at the first terminal of the capacitor C in the first $DSU_A$ 640, a voltage $V_{CB}$ at the first terminal of the capacitor C in the second $DSU_B$ 645, the first output signal $out_A$, and the second output signal $out_B$. It shall be understood that the timing diagram may also be applicable to TDA 600 with the exception that the $READ_A$ and $READ_B$ signals and the voltages $V_{CA}$ and $V_{CB}$ are inverted.

In normal operation (e.g., no saturation), the input delay $\Delta T_j$ is such that transitions of the input signals $in_A$ and $in_B$ occur before DSU capacitor voltage $V_{CA}$ or $V_{CB}$ crosses the corresponding reference voltage of the DSU. This ensures that the TDA core 500 generates the output signals outA and outB with transitions separated in time by the amplified delay $G*\Delta T_j$. In saturation conditions, the time delay $\Delta T_j$ between transitions in the input signals $in_A$ and $in_B$ is large enough that the DSU capacitor voltage $V_{CA}$ or $V_{CB}$ crosses the reference voltage of the comparator 570 before second transition has occurred. This is further explained with reference to the input signal $in_A$ transitioning first, but it shall be understood that the input signal $in_B$ could be the one that transitions first.

As depicted in the timing diagram of FIG. 7A, the input signal $in_A$ has a rising transition that occurs before the rising transition of the input signal $in_B$. However, in this example, the delay $\Delta T_j$ between the transitions is so large that the DSU capacitor voltage $V_{CA}$ crosses and falls below the reference voltage $V_{ref2}$ before the rising transition of the input signal $in_B$. As a result, the output signal $out_A$ transitions before the corresponding $READ_A$ signal. As a result, the delay between transitions of the output signals $out_A$ and $out_B$ is no longer the designed delay $G^*\Delta T_j$. And, consequently, the TDA core 500 generates unreliable output signals $out_A$ and $out_B$ (e.g., output signals in error). As discussed further herein, a TDC may include a saturation detector to deal with saturation conditions.

Figure 7B:
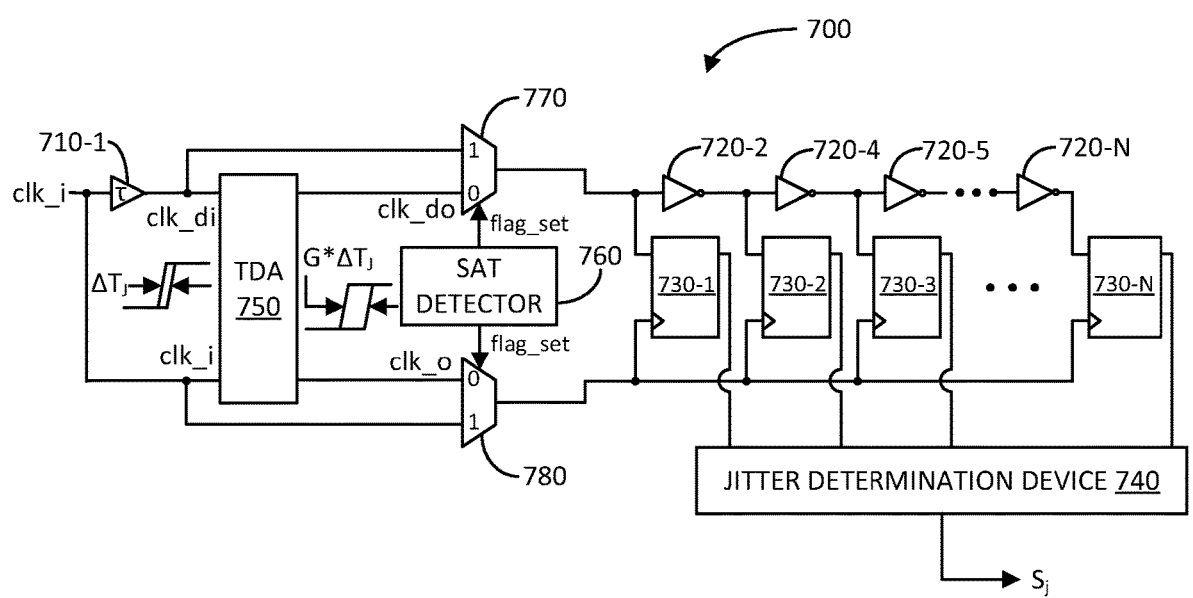
FIG. 7B illustrates schematic and timing diagrams of an exemplary time-to-digital circuit (TDC) including an associated time difference amplifier (TDA), saturation detector, and saturation compensation circuit in accordance with another aspect of the disclosure.

FIG. 7B illustrates schematic and timing diagrams of an exemplary time-to-digital circuit (TDC) 700 including an associated time difference amplifier (TDA) 750, a saturation detector 760, and saturation compensation circuit including multiplexers 770 and 780 in accordance with another aspect of the disclosure. The TDC 700 is similar to that of TDC 300 previously discussed, and includes many of the same or similar elements, such as a set of cascaded delay elements 710-1 to 710-N, a set of flip-flops 730-1 to 730-N, a jitter determination device 740, and the TDA 750 in a similar configuration as those same or similar elements in TDC 300.

The TDC 700 differs from TDC 300 in that TDC 700 further includes the saturation detector 760 and the saturation compensation circuit including the multiplexers 770 and 780. The saturation detector 760 is configured to detect whether the TDA 750 is undergoing saturation, and assert a saturation detection signal flag_set if it detects the saturation condition. If the TDA 750 is not undergoing saturation, the saturation detector 760 generates a deasserted saturation detection signal flag_set (e.g., at a low logic level). In response, the multiplexers 770 and 780 output the delayed output clock clk_do and output clock clk_0 generated by the TDA 750 because no saturation implies the amplified delay $G^*\Delta T_j$ has been accurately applied to the output signals. If the TDA 750 is undergoing saturation, the saturation detector 760 generates an asserted saturation detection signal flag_set (e.g., at a high logic level). In response, the multiplexers 770 and 780 output the delayed input clock clk_di and input clock clk_i; thereby, bypassing the TDA 750 as saturation implies the TDA 750 has generated unreliable output signals for jitter measurement purpose.

Figure 8:
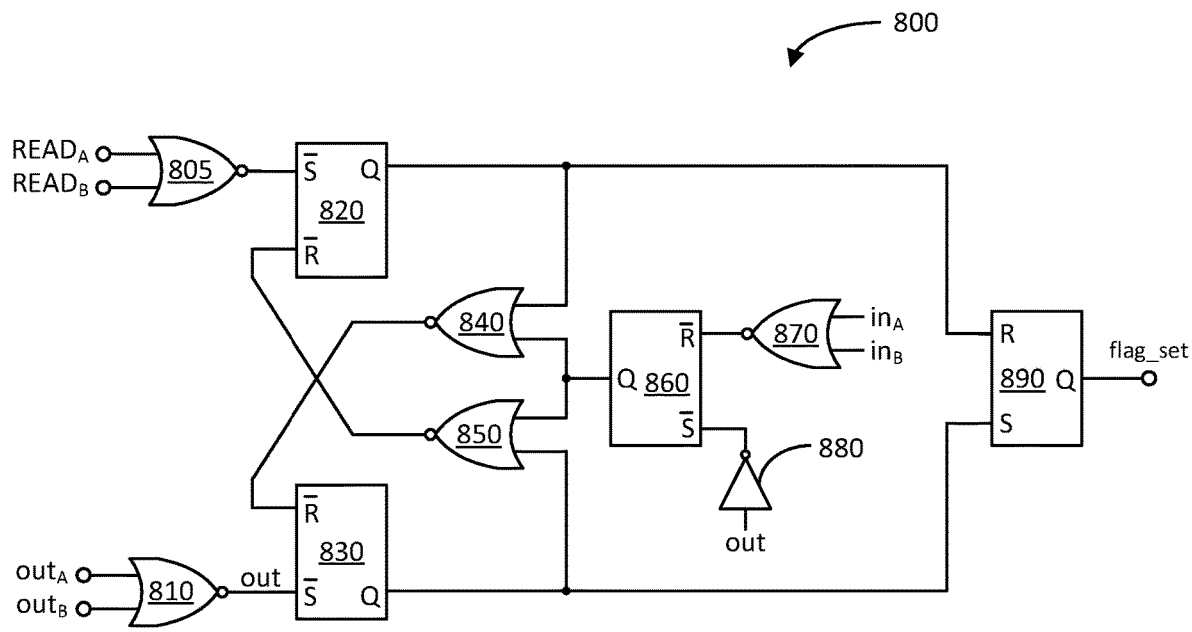
FIG. 8 illustrates a schematic diagram of an exemplary saturation detector in accordance with another aspect of the disclosure.

FIG. 8 illustrates a schematic diagram of an exemplary saturation detector 800 in accordance with another aspect of the disclosure. In summary, the saturation detector 800 detects whether a TDA is undergoing saturation if any of the output signal $out_A$ or $out_B$ transitions before any of the read signal $READ_A$ or $READ_B$. The saturation detector 800 uses any of the input signal $in_A$ or $in_B$ to enable the saturation detection near a beginning of an amplification cycle of a TDA. The saturation detector 800 uses any of the output signal $in_A$ or $in_B$ to setup for the next amplification cycle.

More specifically, the saturation detector 800 includes NOR gates 805, 810, 840, 850, and 870, SR latches 820, 830, and 860, inverter 880, and output SR latch 890. The NOR gate 805 includes inputs to receive the $READ_A$ and $READ_B$ signals from a TDA. The NOR gate 810 includes inputs to receive the $out_A$ and $out_B$ signals from a TDA. The NOR gate 870 includes inputs to receive the $in_A$ and $in_B$ signals.

The SR latch 820 includes a complementary set input S coupled to an output of the NOR gate 805, a complementary reset input R coupled to an output of the NOR gate 850, and a Q output coupled to an input of the NOR gate 840 and a reset input R of the output SR latch 890. The SR latch 830 includes a complementary set input $\overline{S}$ coupled to an output of the NOR gate 810, a complementary reset input $\overline{R}$ coupled to an output of the NOR gate 840, and a Q output coupled to an input of the NOR gate 850 and a set input S of the output SR latch 890.

The SR latch 860 includes a complementary set input $\overline{S}$ coupled to an output of the inverter 880, a complementary reset input $\overline{R}$ coupled to an output of the NOR gate 870, and a Q output coupled to the other inputs of the NOR gates 840 and 850, respectively. The inverter 880 includes an input coupled to an output of the NOR gate 810. The output SR latch 890 includes a Q output configured to produce the saturation detection signal flag_set, as discussed with reference to saturation detector 760.

The operation of the saturation detector 800 is as follows: As discussed with reference with FIG. 7A, a saturation condition occurs when any of the output signal $out_A$ or $out_B$ transitions before any of the read signal $READ_A$ or $READ_B$. The latch operation provided by the cross-coupled configuration of the SR latches 820 and 830 and NOR gates 840 and 850 is configured to capture the saturation condition or lack thereof.

More specifically, at a beginning of an amplification cycle of a TDA as previously discussed in detail, the SR latch 860 generates Q at a high logic level in response to any of the output signals $out_A$ or $out_B$ going high from the previous amplification cycle. This effectively disables the latch operation of the cross-coupled SR latches 820/830 and NOR gates 840/850. When one of the input signal $in_A$ or $in_B$ undergoes a first rising transition in the next amplification cycle, the NOR gate 870 outputs a low logic level, and causes the SR latch 860 to output (Q) a low logic level. This enables the cross-coupled SR latches 820/830 and NOR gates 840/850 for saturation detection purposes.

If any of the $READ_A$ and $READ_B$ signals transitions before any of the $out_A$ and $out_B$ signals during normal TDA operation (e.g., no saturation), the NOR gate 805 generates a low logic level. In response, the SR latch 820 generates a Q output at a high logic level. In response, the NOR gate 840 generates a low logic level. In response, the SR latch 830 generates the Q output at a low logic level. Accordingly, the reset and set inputs R and S of the output SR latch 890 are high and low, respectively. In response, the SR latch 890 outputs (Q) a de-asserted saturation detection signal flag_set (e.g., at a low logic level).

If, on the other hand, any of the $out_A$ and $out_B$ signals transitions before any of the $READ_A$ and $READ_B$ signals during saturation of the TDA, the NOR gate 810 generates a low logic level. In response, the SR latch 830 generates a Q output at a high logic level. In response, the NOR gate 850 generates a low logic level. In response, the SR latch 820 generates the Q output at a low logic level. Accordingly, the reset and set inputs R and S of the output SR latch 890 are low and high, respectively. In response, the SR latch 890 outputs (Q) an asserted saturation detection signal flag_set (e.g., at a high logic level).

Figure 9:
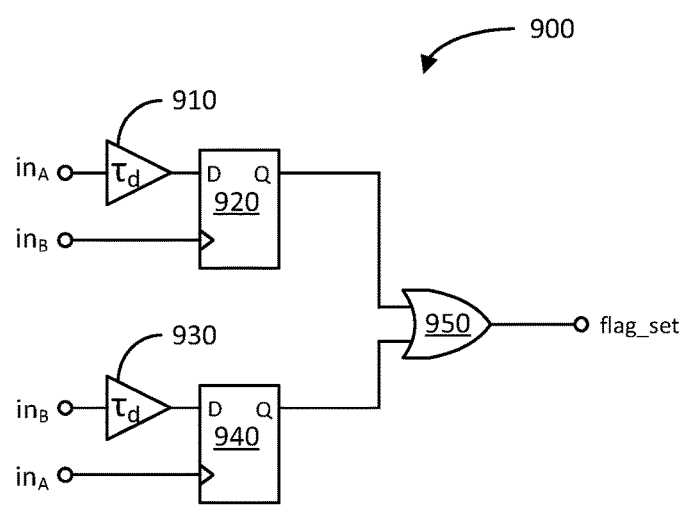
FIG. 9 illustrates a schematic diagram of another exemplary saturation detector in accordance with another aspect of the disclosure.

FIG. 9 illustrates a schematic diagram of another exemplary saturation detector 900 in accordance with another aspect of the disclosure. The saturation detector 900 includes a first delay element 910, a first flip-flop 920, a second delay element 930, and a second flip-flop 940, and an OR gate 950.

The first delay element 910 includes an input configured to receive the first input signal $in_A$. The first delay element 910 may be configured as a non-inverting delay element, and may include a set of cascaded inverters, a set of cascaded buffers, or any combination thereof. The first delay element 910 is configured to delay the input signal $in_A$ by a minimum delay $\tau_d$ indicating a saturation condition. The first delay element 910 includes an output coupled to a data input (D) of the first flip-flop 920. The first flip-flop 920 includes a clock input configured to receive the second input signal $in_B$.

Similarly, the second delay element 930 includes an input configured to receive the second input signal $in_B$. The second delay element 930 may be configured as a non-inverting delay element, and may include a set of cascaded inverters, a set of cascaded buffers, or any combination thereof. The second delay element 930 is configured to delay the input signal $in_B$ by the minimum delay $\tau_d$ indicating a saturation condition. The second delay element 930 includes an output coupled to a data input (D) of the second flip-flop 940. The second flip-flop 940 includes a clock input configured to receive the second input signal $in_B$.

The first and second flip-flips 920 and 940 includes outputs (Q) coupled to inputs of the OR gate 950, respectively. The OR gate 950 is configured to output the saturation detection signal flag_set, as described with reference to saturation detector 760 previously discussed.

During normal operation of a TDA (e.g., no saturation), the delay $\Delta T_j$ between adjacent rising transitions in the input signals $in_A$ and $in_B$ is less than the minimum delay $\tau_d$ indicating a saturation condition. Thus, if input signal $in_A$ transitions first, the first flip-flop 920 outputs a low logic level when clocked by the subsequent rising transition of the input signal $in_B$ if the delay $\Delta T_j$ is less than $\tau_d$. In this case, the second flip-flop 940 outputs a low logic level because the input signal $in_A$ transitioned first. In response to the low logic levels at its inputs, the OR gate 950 generates a deasserted saturation detection signal flag_set.

Similarly, during normal operation of the TDA, if input signal $in_B$ transitions first, the second flip-flop 940 outputs a low logic level when clocked by the subsequent rising transition of the input signal $in_A$ if the delay $\Delta T_j$ is less than $\tau_d$. In this case, the first flip-flop 920 also outputs a low logic level because the input signal $in_B$ transitioned first. In response to the low logic levels at its inputs, the OR gate 950 generates a deasserted saturation detection signal flag_set.

During saturation condition of a TDA, the delay $\Delta T_j$ between adjacent rising transitions in the input signals $in_A$ and $in_B$ is greater than the minimum delay $\tau_d$ indicating a saturation condition. Thus, if input signal $in_A$ transitions first, the first flip-flop 920 outputs a high logic level when clocked by the subsequent rising transition of the input signal $in_B$ because by that time the input signal $in_A$ has arrived at the data input (D) of the first flip-flop 920. In this case, the second flip-flop 940 outputs a low logic level because the input signal $in_A$ transitioned first. In response to the high logic level at one of its inputs, the OR gate 950 generates an asserted saturation detection signal flag_set.

Similarly, during normal operation of the TDA, if input signal $in_B$ transitions first, the second flip-flop 940 outputs a high logic level when clocked by the subsequent rising transition of the input signal $in_A$ because by that time the input signal $in_B$ has arrived at the data input (D) of the second flip-flop 940. In this case, the first flip-flop 920 outputs a low logic level because the input signal $in_B$ transitioned first. In response to the high logic level at one of its inputs, the OR gate 950 generates an asserted saturation detection signal flag_set.

Figure 10:
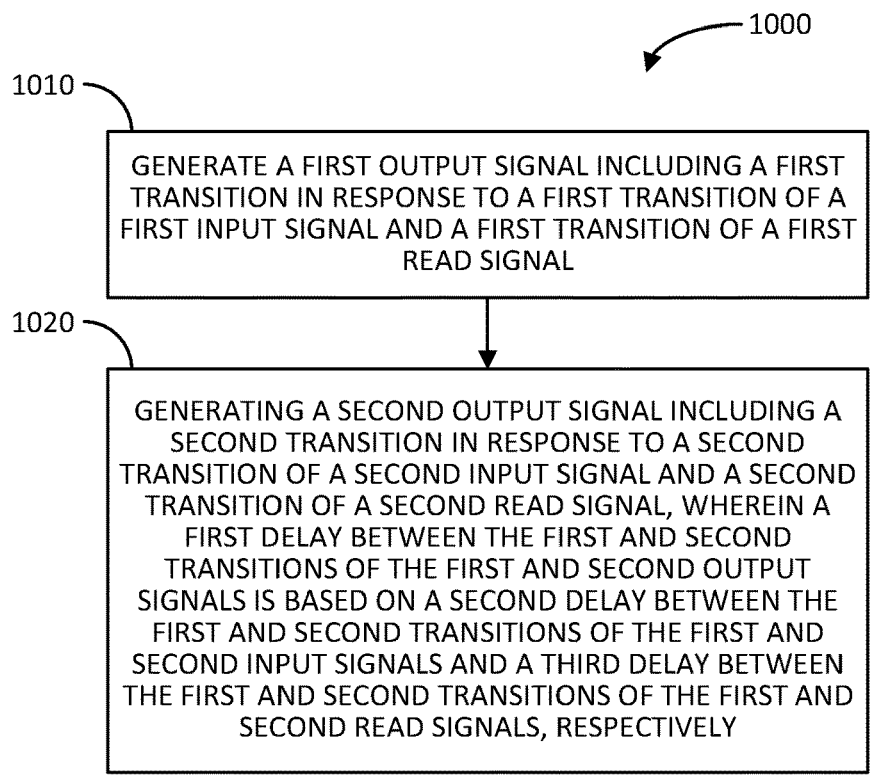
FIG. 10 illustrates a flow diagram of an exemplary method of generating a time difference between two signals in accordance with another aspect of the disclosure.

FIG. 10 illustrates a flow diagram of an exemplary method 1000 of generating a time difference between two signals in accordance with another aspect of the disclosure. The method 1000 includes generating a first output signal including a first transition in response to a first transition of a first input signal and a first transition of a first read signal (block 1010). A means for generating a first output signal including a first transition in response to a first transition of a first input signal and a first transition of a first read signal includes any of the first DSUs described herein.

The method 1000 further includes generating a second output signal including a second transition in response to a second transition of a second input signal and a second transition of a second read signal (block 1020). A means for generating a second output signal including a second transition in response to a second transition of a second input signal and a second transition of a second read signal includes any of the second DSUs described herein. According to the method 1000, a first delay between the first and second transitions of the first and second output signals is based on a second delay between the first and second transitions of the first and second input signals and a third delay between the first and second transitions in the first and second read signals, respectively.

Figure 11:
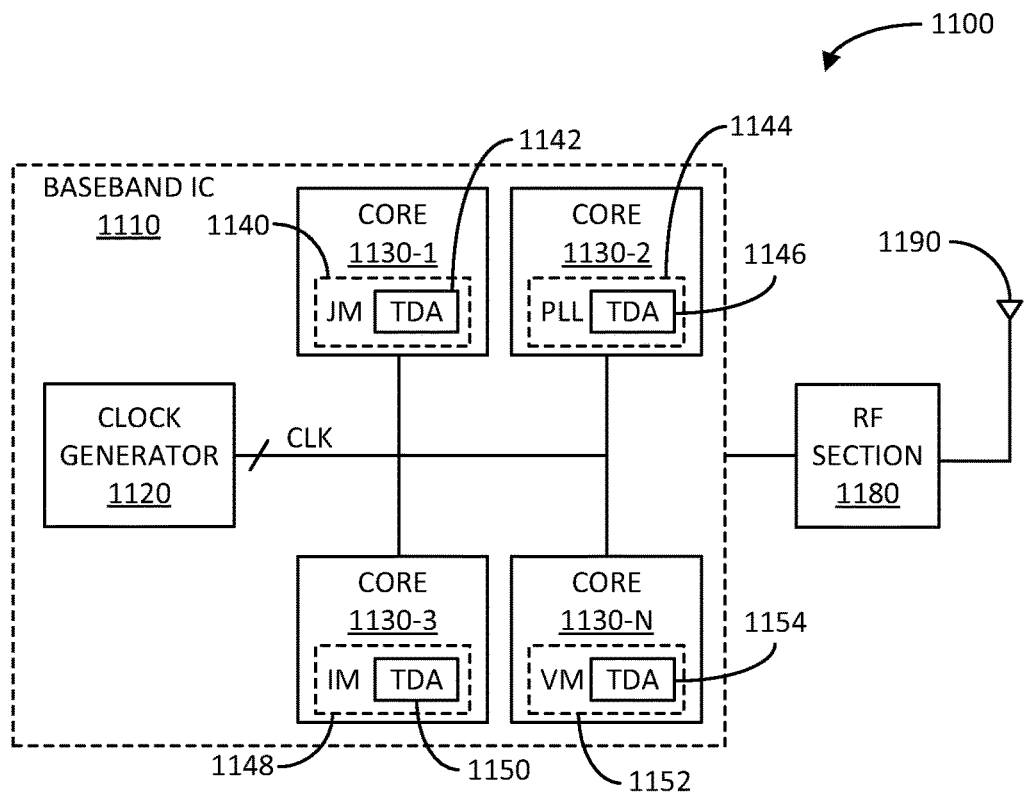
FIG. 11 illustrates a block diagram of an exemplary wireless communication device in accordance with another aspect of the disclosure.

FIG. 11 illustrates a block diagram of an exemplary wireless communication device 1100 in accordance with another aspect of the disclosure. The wireless communication device 1100 may be configured as a smart phone, desktop computer, laptop computer, computing pad or tablet, or other types of wireless computing device. The wireless communication device 1100 includes a baseband integrated circuit (IC) 1110, a radio frequency (RF) section 1180, and at least one antenna 1190.

The baseband IC 1110 includes a clock generator 1120 and a set of one or more cores 1130-1 to 1130-N. The clock generator 1120 is configured to generate one or more clocks for the set of one or more cores 1130-1 to 1130-N. The set of one or more cores 1130-1 to 1130-N may be configured for different operations, such as central processing unit (CPU) operations, graphics processing unit (GPU) applications, digital signal processing (DSP) applications, data storage (memory) applications, modulation/demodulation (MODEM) applications, etc.

The set of one or more cores 1130-1 to 1130-N may include time-difference amplifiers (TDAs) used for different applications. Each of these TDAs may be configured per any of the TDAs previously described herein. For example, the core 1130-1 may include a clock jitter measurement (JM) device 1140 including a TDA 1142 configured to measure jitter associated with one or more clock(s) CLK generated by the clock generator 1120. The core 1130-2 may include a phase locked loop (PLL) 1144 including a TDA 1146 configured to generate one or more other clocks or signals internal to the core 1130-2. The core 1130-3 may include a current measurement (IM) circuit 1148 including a TDA 1150 configured to measure a current provided to one or more circuits in the core 1130-3. And, the core 1130-N may include a voltage measurement (VM) circuit 1152 including a TDA 1154 configured to measure voltage droop (or other parameter) of a supply voltage applied to one or more circuits in the core 1130-N. These are just a few examples among many applications for the TDAs described herein.

The baseband IC 1110 may provide a transmit baseband signal to the RF section 1180. In response, the RF section

1180 may convert the transmit baseband signal from digital-to-analog, up-convert the transmit analog signal to an RF signal, power amplify the RF signal, and provide the amplified RF signal to the at least one antenna 1190 for wireless transmission to one or more other wireless devices. The RF section 1180 may also receive an RF signal from one or more other wireless devices via the at least one antenna 1190, low noise amplify the RF signal, downconvert the RF signal into an analog baseband signal, convert the analog baseband signal from analog-to-digital, and provide the digital baseband signal to the baseband IC 1110 for further processing.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a time difference amplifier (TDA), comprising:
     a first NOR gate including a first input to receive a first input signal and a second input to receive a reset signal;
     a first delay element including an input to receive the first input signal;
     a second NOR gate including a first input to receive a second input signal and a second input to receive the reset signal;
     a second delay element including an input to receive the second input signal;
     a logic gate including inputs coupled to outputs of the first and second NOR gates, respectively;
     a first delay storage unit (DSU) including a first input coupled to the output of the first NOR gate, a second input coupled to an output of the first delay element, a third input coupled to an output of the logic gate, and an output to generate a first output signal; and
     a second delay storage unit (DSU) including a first input coupled to the output of the second NOR gate, a second input coupled to an output of the second delay element, a third input coupled to the output of the logic gate, and an output to generate a second output signal.

2. The apparatus of claim 1, wherein the first and second delay elements are non-inverting delay elements, respectively.

3. The apparatus of claim 1, wherein the logic gate comprises an OR gate.

4. The apparatus of claim 1, further comprising:
   a first inverter including an input coupled to the output of the first NOR gate and an output coupled to the first input of the first DSU; and
   a second inverter including an input coupled to the output of the second NOR gate and an output coupled to the first input of the second DSU.

5. The apparatus of claim 1, wherein the first and second delay elements are inverting delay elements, respectively.

6. The apparatus of claim 1, wherein the logic gate comprises a NOR gate.

7. The apparatus of claim 1, wherein the first or second DSU comprises:
   a charging/discharging circuit including the first, second, and third inputs of the first or second DSU;
   a capacitor coupled to the charging/discharging circuit; and
   a comparator coupled to the capacitor, and including the output of the first or second DSU.

8. The apparatus of claim 7, wherein the charging/discharging circuit comprises:
   a p-channel metal oxide semiconductor field effect transistor (PMOS FET), a first n-channel metal oxide semiconductor field effect transistor (NMOS FET), and a second NMOS FET coupled in series between an upper voltage rail and an intermediate node, wherein the PMOS FET and the first NMOS FET include gates coupled together and serve as the first input of the first or second DSU, wherein the PMOS FET and the first NMOS FET include drains coupled together and to a first terminal of the capacitor, wherein the capacitor includes a second terminal coupled to a lower voltage rail, wherein the second NMOS FET includes a gate coupled to the upper voltage rail; and
   third and fourth NMOS FETs coupled in parallel between the intermediate node and the lower voltage rail, wherein the third NMOS FET includes a gate that serves as the second input of the first or second DSU, and the fourth NMOS FET includes a gate that serves as the third input of the first or second DSU.

9. The apparatus of claim 7, wherein the charging/discharging circuit comprises:
   a first p-channel metal oxide semiconductor field effect transistor (PMOS FET) and a second PMOS FET coupled in parallel between an upper voltage rail and an intermediate node, wherein the first PMOS FET includes a gate that serves as the second input of the first or second DSU, and the second PMOS FET includes a gate that serves as the third input of the first or second DSU; and
   third and fourth PMOS FETs and an n-channel metal oxide semiconductor field effect transistor (NMOS FET), wherein the third and fourth PMOS FETs and the NMOS FET are coupled in series between the intermediate node and a lower voltage rail, wherein the third PMOS FET includes a gate coupled to the lower voltage rail, wherein the fourth PMOS FET and the NMOS FET include gates coupled together and serve as the first input of the first or second DSU, wherein the fourth PMOS FET and the NMOS FET include drains coupled together and to a first terminal of the capacitor, and wherein the capacitor includes a second terminal coupled to the upper voltage rail.

10. The apparatus of claim 7, wherein the comparator comprises an inverter including an input coupled to the capacitor and an output that serves as the output of the first or second DSU.

11. The apparatus of claim 7, wherein the comparator comprises a Schmidt trigger including an input coupled to the capacitor and an output that serves as the output of the first or second DSU.

12. The apparatus of claim 7, wherein the comparator comprises:
   a first p-channel metal oxide semiconductor field effect transistor (PMOS FET), a second PMOS FET, a first n-channel metal oxide semiconductor field effect transistor (NMOS FET), and a second NMOS FET coupled in series between an upper voltage rail and a lower voltage rail, wherein the first and second PMOS FETs and the first and second NMOS FETs include gates coupled to the capacitor;

a third PMOS FET coupled between a drain of the first PMOS FET and the lower voltage rail; and a third NMOS FET coupled between the upper voltage rail and a drain of the second NMOS FET, wherein the third PMOS FET and the third NMOS FET include gates coupled to drains of the second PMOS FET and the first NMOS FET, wherein the gates of the third PMOS FET and the third NMOS FET serve as the output of the first or second DSU.

13. The apparatus of claim 7, wherein the comparator comprises:

a first p-channel metal oxide semiconductor field effect transistor (PMOS FET), a second PMOS FET, a first n-channel metal oxide semiconductor field effect transistor (NMOS FET), and a second NMOS FET coupled in series between an upper voltage rail and a lower voltage rail, wherein the first and second PMOS FETs and the first and second NMOS FETs include gates coupled to the capacitor;

a third PMOS FET coupled between a drain of the first PMOS FET and the lower voltage rail;

a third NMOS FET coupled between the upper voltage rail and a drain of the second NMOS FET, wherein the third PMOS FET and the third NMOS FET include gates coupled to drains of the second PMOS FET and the first NMOS FET; and an inverter including an input coupled to the gates of the third PMOS FET and the third NMOS FET, and an output that serves as the output of the first or second DSU.

14. The apparatus of claim 1, further including a set/reset circuit comprising:

a set/reset (SR) latch including an output to generate the reset signal and coupled to the second inputs of the first and second NOR gates, respectively;

a first NAND gate including inputs to receive the first and second inputs signals, and an output coupled to a set input of the SR latch; and a second NAND gate including inputs to receive the first and second output signals, and an output coupled to a reset input of the SR latch.

15. The apparatus of claim 1, further including a saturation detector, comprising:

a third NOR gate including inputs to receive the first and second input signals, respectively;

a fourth NOR gate including inputs to receive the first and second output signals, respectively;

a fifth NOR gate including inputs coupled to the outputs of the first and second delay elements, respectively;

an inverter including an input coupled to an output of the fourth NOR gate;

a first set/reset (SR) latch including a set input coupled to an output of the inverter, and a reset input coupled to an output of the third NOR gate;

a second set/reset (SR) latch including a set input coupled to the output of the fourth NOR gate;

a third set/reset (SR) latch including a set input coupled to the output of the fifth NOR gate;

a sixth NOR gate including a first input coupled to an output of the first SR latch, a second input coupled to an output of the second SR latch, and an output coupled to a reset input of the third SR latch;

a seventh NOR gate including a first input coupled to the output of the first SR latch, a second input coupled to an output of the third SR latch, and an output coupled to a reset input of the second SR latch; and a fourth set/reset (SR) latch including a set input coupled to the output of the second SR latch, a reset input coupled to the output of the third SR latch, and an output to generate a saturation detection signal.

16. The apparatus of claim 1, further including a saturation detector, comprising:

a first delay element including an input to receive the first input signal;

a first flip-flop including a data input coupled to an output of the first delay element, and a clock input to receive the second input signal;

a second delay element including an input to receive the second input signal;

a second flip-flop including a data input coupled to an output of the second delay element, and a clock input to receive the first input signal; and an OR gate including a first input coupled to an output of the first flip-flop, a second input coupled to an output of the second flip-flop, and an output to generate a saturation detection signal.

17. The apparatus of claim 1, further comprising:

a saturation detector including inputs to receive the first and second input signals, respectively;

a first multiplexer including inputs to receive the first input signal and the first output signal, respectively, and a select input coupled to an output of the saturation detector;

a second multiplexer including inputs to receive the second input signal and the second output signal, respectively, and a select input coupled to the output of the saturation detector; and a time-to-digital circuit (TDC) including inputs coupled to outputs of the first and second multiplexers, respectively.

18. The apparatus of claim 17, wherein the TDC comprises:

a set of cascaded delay elements including an input serving as the input of the TDC coupled to the output of the first multiplexer; and a set of flip-flops including data inputs coupled to outputs of the set of cascaded delay elements, respectively, and clock inputs collectively serving as the input of the TDC coupled to the output of the second multiplexer.

19. The apparatus of claim 17, wherein the TDC further comprises a jitter determination device including inputs coupled to outputs of the set of flip-flops, respectively.

20. An apparatus, comprising:

a time difference amplifier (TDA), comprising:

a first delay storage unit (DSU) configured to generate a first output signal including a first transition in response to a first transition of a first input signal and a first transition of a first read signal;

a first delay element configured to delay the first input signal to generate the first read signal;

a second DSU configured to generate a second output signal including a second transition in response to a second transition of a second input signal and a second transition of a second read signal; and a second delay element configured to delay the second input signal to generate the second read signal;

wherein a first delay between the first and second transitions of the first and second output signals is based on a second delay between the first and second transitions of the first and second input signals and a third delay between the first and second transitions in the first and second read signals, respectively.

21. The apparatus of claim 20, further comprising a time-to-digital circuit (TDC) configured to generate a digital signal based on the first delay or the second delay.

22. The apparatus of claim 21, further comprising a saturation detector configured to:
   determine whether the TDA is undergoing saturation;
   control the TDC to generate the digital signal based on the first delay if it determines that the TDA is not undergoing saturation; and
   control the TDC to generate the digital signal based on the second delay if it determines that the TDA is undergoing saturation.

23. The apparatus of claim 21, further comprising a jitter determination circuit configured to generate a jitter measurement signal based on the digital signal.

24. A method, comprising:
   generating a first output signal including a first transition in response to a first transition of a first input signal and a first transition of a first read signal;
   delaying the first input signal to generate the first read signal;
   generating a second output signal including a second transition in response to a second transition of a second input signal and a second transition of a second read signal; and
   delaying the second input signal to generate the second read signal;
   wherein a first delay between the first and second transitions of the first and second output signals is based on a second delay between the first and second transitions of the first and second input signals and a third delay between the first and second transitions in the first and second read signals, respectively.

25. The method of claim 24, further comprising generating a digital signal based on the first delay or the second delay.

26. The method of claim 25, further comprising:
   determining whether the second delay exceeds a threshold;
   controlling the TDC to generate the digital signal based on the first delay if it determines that the second delay does not exceed the threshold; and
   controlling the TDC to generate the digital signal based on the second delay if it determines that the second delay exceeds the threshold.

27. The apparatus of claim 25, further comprising generating a jitter measurement signal based on the digital signal.

28. An apparatus, comprising:
   means for generating a first output signal including a first transition in response to a first transition of a first input signal and a first transition of a first read signal;
   means for delaying the first input signal to generate the first read signal;
   means for generating a second output signal including a second transition in response to a second transition of a second input signal and a second transition of a second read signal; and
   means for delaying the second input signal to generate the second read signal;
   wherein a first delay between the first and second transitions of the first and second output signals is based on a second delay between the first and second transitions of the first and second input signals and a third delay between the first and second transitions in the first and second read signals, respectively.

29. The apparatus of claim 28, further comprising means for generating a digital signal based on the first delay or the second delay.

30. The apparatus of claim 29, further comprising:
   means for determining whether the second delay exceeds a threshold;
   means for controlling the TDC to generate the digital signal based on the first delay if it determines that the second delay does not exceed the threshold; and
   means for controlling the TDC to generate the digital signal based on the second delay if it determines that the second delay exceeds the threshold.

* * * * *